United States Patent
Abe et al.

(10) Patent No.: US 8,040,134 B2
(45) Date of Patent: Oct. 18, 2011

(54) MAGNETIC RESONANCE IMAGING DEVICE CONFIGURED TO SUPPRESS SIGNALS FROM FAT BY EXCLUDING EFFECT OF NON-UNIFORMITY OF IRRADIATED MAGNETIC FIELD

(75) Inventors: Takayuki Abe, Tokyo (JP); Hiroyuki Takeuchi, Tokyo (JP); Tetsuhiko Takahashi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 241 days.

(21) Appl. No.: 12/439,104

(22) PCT Filed: Sep. 28, 2007

(86) PCT No.: PCT/JP2007/069056
§ 371 (c)(1),
(2), (4) Date: Feb. 26, 2009

(87) PCT Pub. No.: WO2008/044501
PCT Pub. Date: Apr. 17, 2008

(65) Prior Publication Data
US 2010/0013478 A1 Jan. 21, 2010

(30) Foreign Application Priority Data

Oct. 6, 2006 (JP) .................................. 2006-275644
May 31, 2007 (JP) .................................. 2007-145224

(51) Int. Cl.
*G01V 3/00* (2006.01)
(52) U.S. Cl. ........................................ 324/309; 324/307
(58) Field of Classification Search .......... 324/300–322; 600/410–435
See application file for complete search history.

(56) References Cited

U.S. PATENT DOCUMENTS

| | | | |
|---|---|---|---|
| 5,429,134 A * | 7/1995 | Foo | 600/413 |
| 6,307,368 B1 * | 10/2001 | Vasanawala et al. | 324/309 |
| 6,781,375 B2 * | 8/2004 | Miyazaki et al. | 324/314 |
| 6,956,374 B2 * | 10/2005 | Busse | 324/314 |
| 7,068,031 B2 * | 6/2006 | Miyoshi | 324/307 |
| 7,164,268 B2 * | 1/2007 | Mugler et al. | 324/307 |
| 7,308,298 B2 * | 12/2007 | Miyazaki | 600/410 |
| 7,405,565 B2 * | 7/2008 | Miyoshi | 324/307 |
| 7,649,354 B2 * | 1/2010 | Bayram et al. | 324/309 |
| 7,847,551 B2 * | 12/2010 | Park | 324/309 |

FOREIGN PATENT DOCUMENTS

| | | |
|---|---|---|
| JP | 7-289534 | 11/1995 |
| JP | 2000-14657 | 1/2000 |
| JP | 2002-263079 | 9/2002 |

OTHER PUBLICATIONS

Li, T., et al., "Real-time Compensation for B0 Field Drift in Proton Echo Planar Spectroscopic Imaging Improves Water Suppression Efficiency", *Proc. Intl. Soc. Mag. Reson. Med.* 13, p. 2524 (2005).

* cited by examiner

*Primary Examiner* — Dixomara Vargas
(74) *Attorney, Agent, or Firm* — Cooper & Dunham LLP

(57) ABSTRACT

A magnetic resonance imaging device includes control means for controlling receiving means according to a predetermined pulse sequence that includes an unnecessary material suppressing sequence unit for suppressing a signal from an unnecessary material which is not a measurement target, and a main imaging sequence unit for measuring a nuclear magnetic resonance signal used to create an image of an examinee. The unnecessary material suppressing sequence unit generates at least two or more high frequency magnetic field pulses so that the longitudinal magnetization of the unnecessary material is made spatially uniform in the imaging space under application of a first high frequency magnetic field pulse in the main imaging sequence unit.

21 Claims, 19 Drawing Sheets

FIG.11
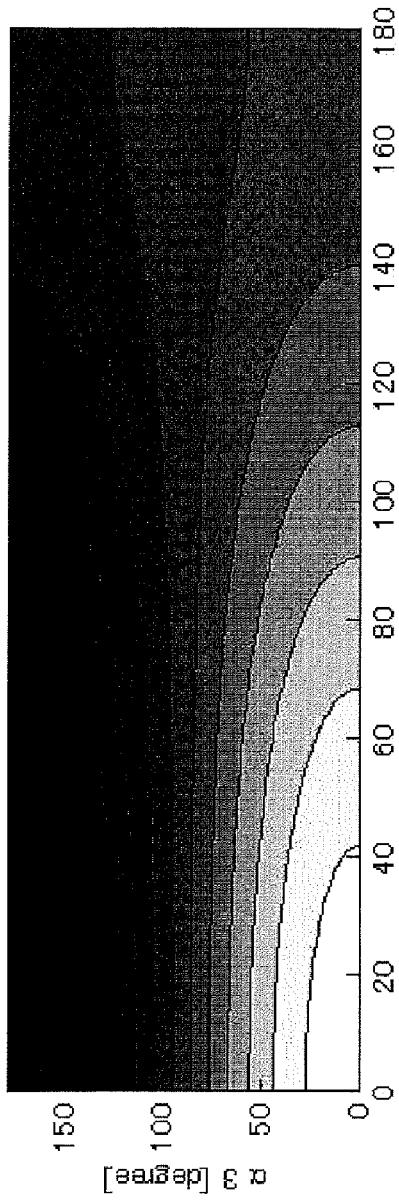
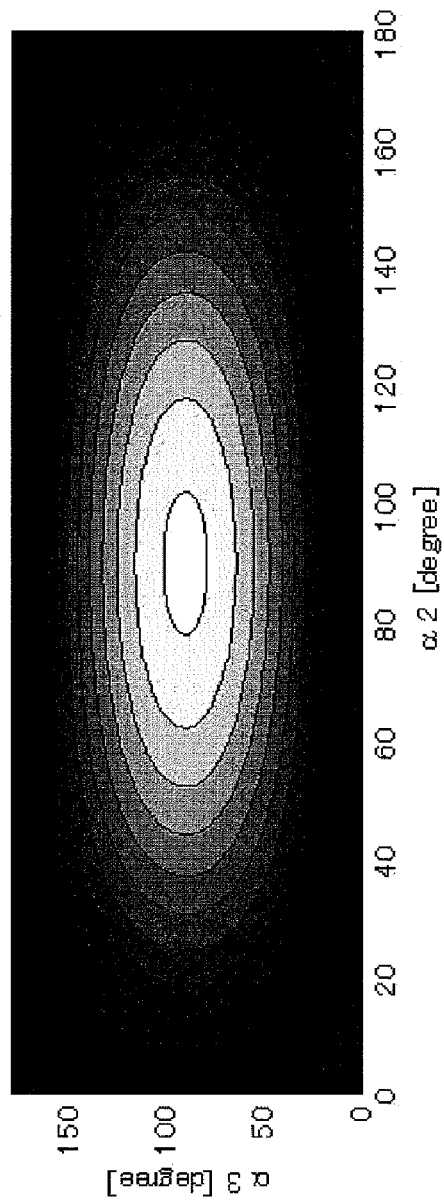

FIG.16
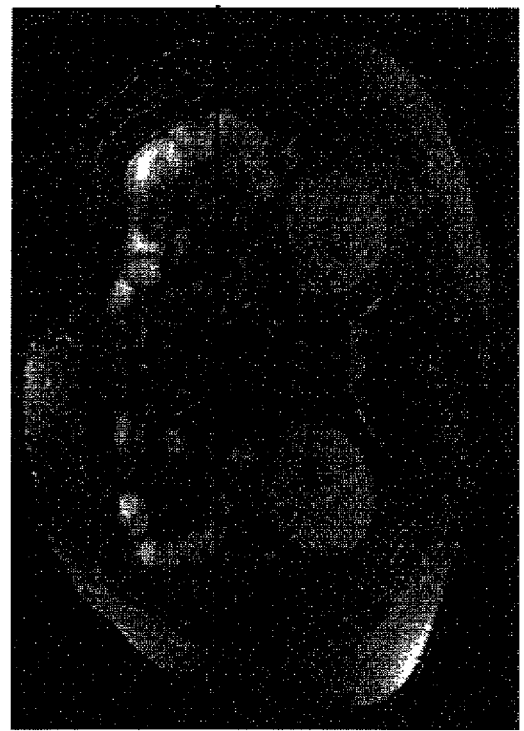
(b) IMAGE OF COMPARATIVE EXAMPLE
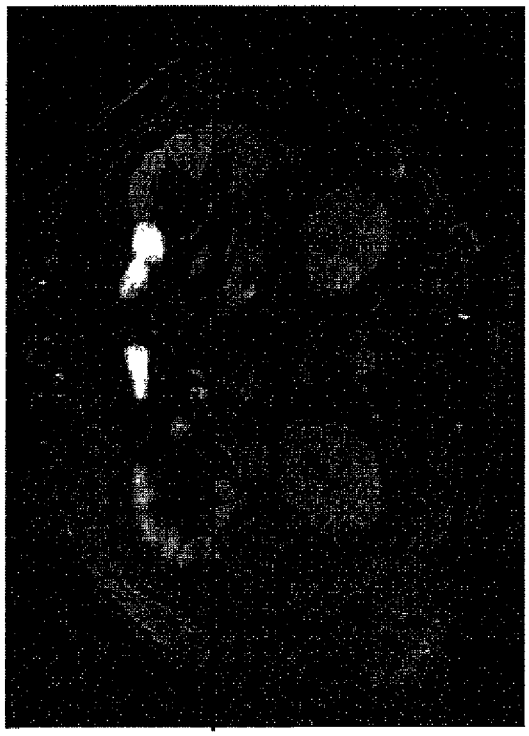
(a) IMAGE OF THIS EMBODIMENT FIG.18
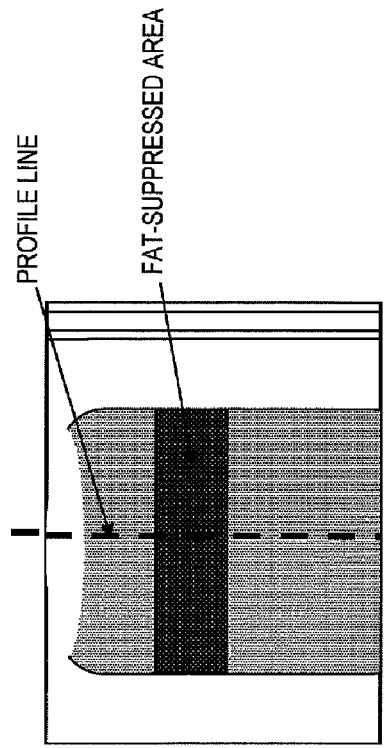
(a) PHANTOM IMAGING EXAMPLE
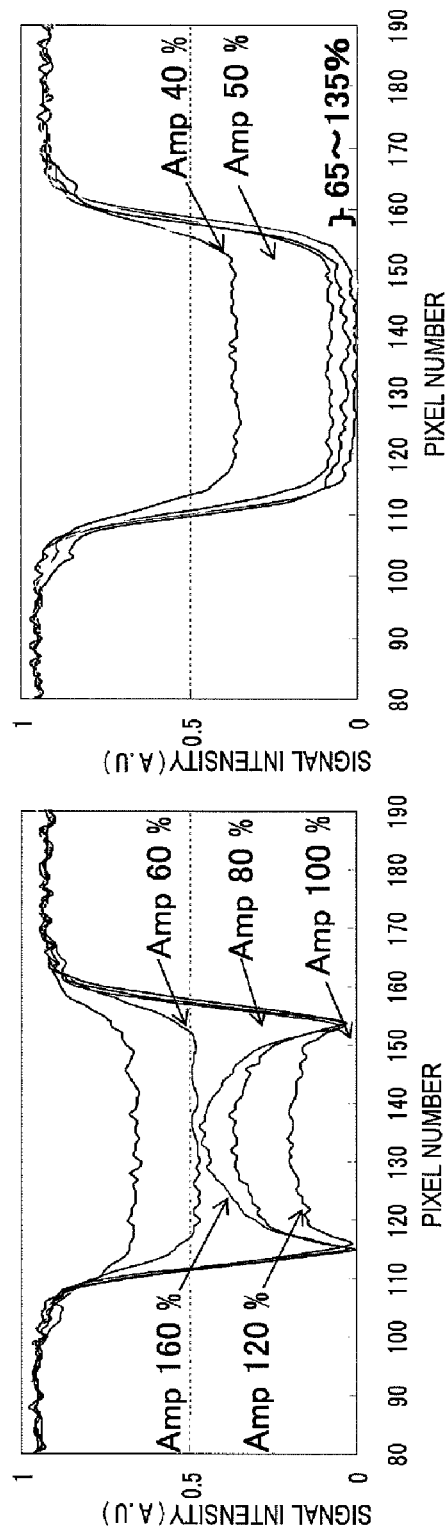
(c) 3-PULSE FAT SUPPRESSION (THIS APPLICATION)
(b) 1-PULSE FAT SUPPRESSION (CONVENTIONAL)

MAGNETIC RESONANCE IMAGING DEVICE CONFIGURED TO SUPPRESS SIGNALS FROM FAT BY EXCLUDING EFFECT OF NON-UNIFORMITY OF IRRADIATED MAGNETIC FIELD

TECHNICAL FIELD

This disclosure relates to a magnetic resonance imaging (hereinafter referred to as MRI) device, and particularly to a technique of suppressing signals from fat by excluding an effect of non-uniformity of irradiated magnetic field.

BACKGROUND ART

A CHESS (Chemical Shift Selective) method is known as one of fat suppressing techniques (techniques of drawing a desired tissue with high contrast by using the difference in chemical shift of proton among tissues) of MRI. According to the CHESS method, protons of a fat tissue are selectively excited by high-frequency magnetic field pulses of 90° having the resonance frequency of the protons of the fat tissue (hereinafter referred to as CHESS pulses), for example, and then a spoil pulse is applied so that transverse magnetization of the excited protons of the fat tissue is subjected to phase dispersion. Thereafter, a normal imaging pulse sequence is executed to measure a signal from only water protons.

However, the fat suppressing technique using the CHESS pulse has a problem that when the irradiation magnetic field based on the CHESS pulse has spatial non-uniformity, non-uniformity occurs in the exciting state of protons of a fat tissue as a suppression target and there occurs an area in which the fat suppression is insufficient.

A conventional technique disclosed in Patent Document 1 is known as a conventional technique to solve this problem. According to the conventional technique described in Patent Document 1, it is disclosed that the effect of the non-uniformity is reduced by applying plural CHESS pulses at different flip angles.

Patent Document 1: JP-A-7-289534

However, as a result of studies of the above conventional technique, the inventor has found the following problem. That is, the Patent Document 1 discloses that plural CHESS pulses are applied to reduce the effect of the spatial non-uniformity of the CHESS pulse itself, however, it has not specifically disclosed any technique of optimizing the flip angle and the application interval of the CHESS pulses.

BRIEF SUMMARY

In an aspect of this disclosure, there is provided an approach to optimize the CHESS method for suppressing fat by applying plural CHESS pulses.

In another aspect, there is provided a magnetic resonance imaging device having magnetostatic field generating means for generating magnetostatic field in an imaging space in which an examinee is disposed, gradient magnetic field generating means for generating gradient magnetic field in the imaging space, high frequency magnetic field generating means for generating high frequency magnetic field in the imaging space, receiving means for detecting a nuclear magnetic resonance signal generated from the examinee, image creating means for creating an image by using the nuclear magnetic resonance signal detected by the receiving means, and control means for controlling these magnetic field generating means and the receiving means according to a predetermined pulse sequence, the predetermined pulse sequence containing an unnecessary material suppressing sequence unit for deleting signals from unnecessary materials which are not measurement targets, and a main imaging sequence unit for measuring a nuclear magnetic resonance signal used to create the image of the examinee, and the unnecessary material suppressing sequence unit generating at least two or more high-frequency magnetic field pulses so that longitudinal magnetization of the unnecessary materials is spatially uniform in the imaging space when a first high-frequency magnetic field pulse is applied in the main imaging sequence unit, is characterized by comprising adjusting means for adjusting flip angles of the two or more high-frequency magnetic field pulses, wherein the control means applies the two or more high-frequency magnetic field pulses at flip angles adjusted by the adjusting means.

BRIEF DESCRIPTION OF THE DRAWINGS

FIG. 11 is a diagram showing an example of two-dimensional data maps of an M(3) value and a differential value dM when the flip angle $\theta_1$ of the first CHESS pulse (201 in FIG. 2) is fixed at 90° and the flip angles $\theta_2$ and $\theta_3$ of the second and third CHESS pulses (202, 203 in FIG. 2) are set as variables.

FIG. 16 shows an image when a volunteer is used.

FIG. 18 is a diagram showing actual measurement of a profile variation (variation of longitudinal magnetization Mz or M(3)) of a fat suppressing area when the CHESS pulse intensity as a whole is changed at Amp40-140% under the state that the ratio of the flip angles of three CHESS pulses is kept to the above value.

DESCRIPTION OF REFERENCE NUMERALS

201 first CHESS pulse, 202 second CHESS pulse, 203 third CHESS pulse, 204, 205, 206 spoiler gradient magnetic field pulse, 210 main imaging sequence unit, 211 RF exciting pulse of the main imaging.

BEST MODES FOR CARRYING OUT THE INVENTION

Figure 1:
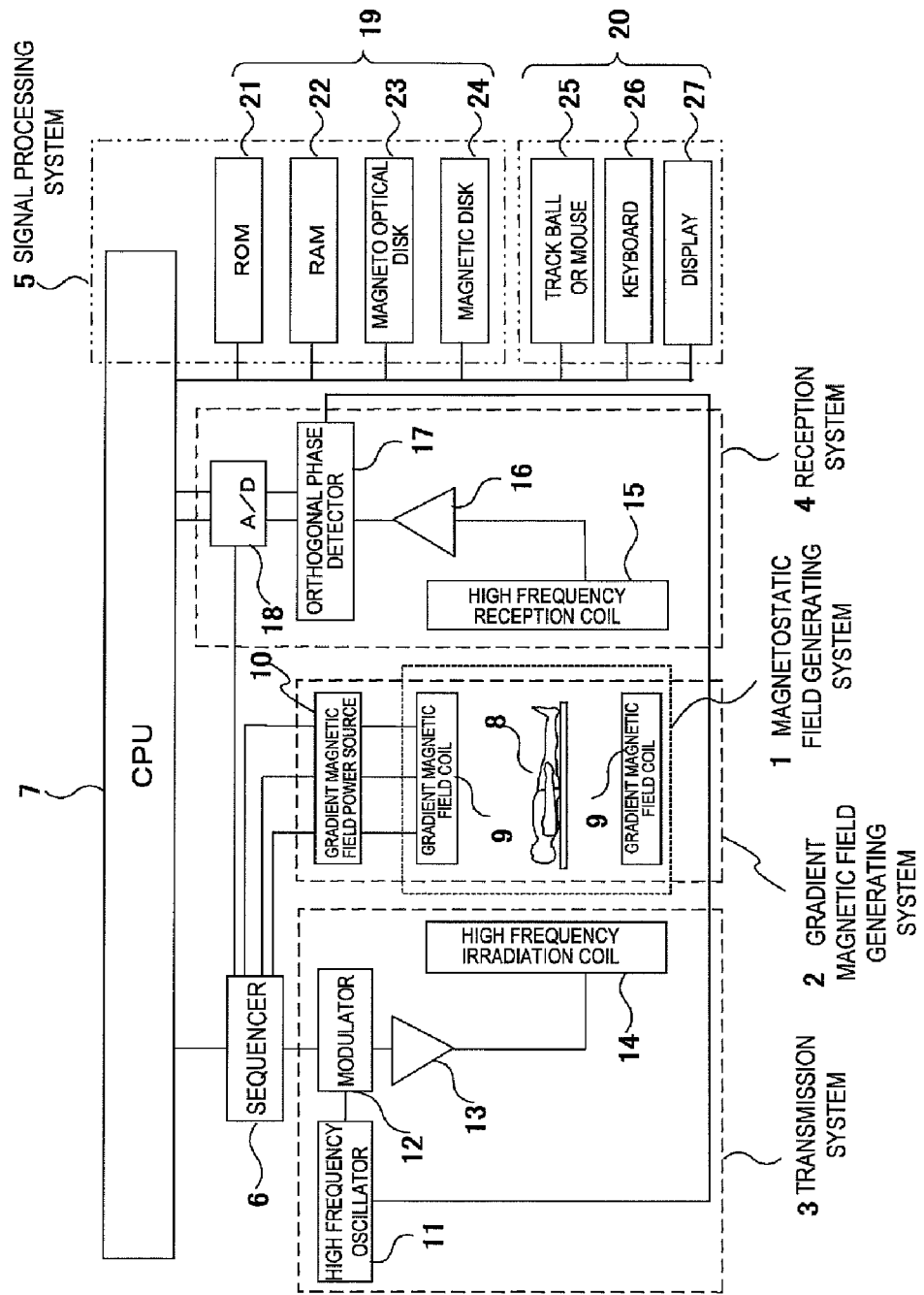
FIG. 1 is a block diagram showing the overall construction of an MRI apparatus of the present invention.

FIG. 1 is a block diagram showing the whole construction of an MRI device constituting the invention. As shown in FIG. 1, the MRI device mainly has a magnetostatic field generating system 1, a gradient magnetic field generating system 2, a transmission system 3, a reception system 4, a signal processing system 5 and a control system (sequencer 6 and CPU 7).

The magnetostatic field generating system 1 generates uniform magnetostatic field in a space (imaging space) surrounding an examinee 8, and it comprises a magneto device of permanent magnet type, normal conduction type, superconduction type or the like.

For example, when the direction of the magnetostatic field is set as Z-direction and two directions orthogonal to the Z-direction are set as X-direction and Y-direction, the gradient magnetic field generating system 2 comprises three gradient magnetic field coils 9 for generating gradient magnetic field pulses in these three axial directions, and a gradient magnetic field power source 10 for driving these three gradient magnetic field coils 9 respectively. By driving the gradient magnetic field power source 10, gradient magnetic field pulses can be generated in the three axial directions of X, Y and Z or in the composite direction of these axial directions. The gradient magnetic field pulse is applied to specify an imaging position of the examinee 8 and also apply position information to an NMR signal occurring from the examinee 8.

The transmission system 3 comprises a high frequency oscillator 11, a modulator 12, a high frequency amplifier 13 and a high frequency irradiation coil 14 for transmission. An RF pulse generated by the high frequency oscillator 11 is modulated to a predetermined envelope signal in the modulator 12, amplified in the high frequency amplifier 13 and then applied to the high frequency irradiation coil 14, whereby electromagnetic waves (high-frequency signal, RF pulse) for inducing magnetic nuclear resonance in atomic nuclei of atoms constituting the examinee are applied to the examinee. The high frequency irradiation coil 14 is normally disposed in proximity to the examinee.

The reception system 4 comprises a high frequency reception coil 15 for reception, an amplifier 16, an orthogonal phase detector 17 and an A/D converter 18. An NMR signal which is generated from the examinee in response to an RF pulse irradiated from the high-frequency irradiation coil 14 for transmission is detected by the high frequency reception coil 15 for reception, amplified in the amplifier 16, converted to a digital amount by the A/D converter 18 through the orthogonal phase detector 17 and then transmitted as collected data of two sequences to the signal processing system 5.

The signal processing system 5 comprises CPU 7, a storage device 19 and an operating unit 20, and various kinds of signal processing such as Fourier Transformation, correction coefficient calculation, image reconstruction, etc. are executed on digital signals received by the reception system 4 in CPU 7. The storage device 19 has ROM 21, RAM 22, a magnetooptical disk 23, a magnetic disk 24, etc. For example, programs for performing time-lapse image analysis processing and measurement, unvaried parameters used for the execution of the programs, etc. are stored in ROM 21, measurement parameters obtained in all the measurements, an echo signal detected in the reception system, etc. are stored in RAM 22, and reconstructed image data are stored in the magnetooptical disk 23 or the magnetic disk 24 respectively. The operating unit 20 has input means such as a track ball or a mouse 25, a keyboard 26, etc., and a display 27 for displaying GUI required for input, processing results in the signal processing system 5, etc. Information necessary for various kinds of processing and control executed by CPU 7 is input through the operating unit 20. An image obtained by image pickup is displayed on the display 27.

The control system comprises the sequencer 6 and CPU 7, and controls the operation of the gradient magnetic field generating system 2, the transmission system 3, the reception system 4 and the signal processing system 5. Particularly, the timing of applying the gradient magnetic field pulse and the RF pulse generated by the gradient magnetic field generating system 2 and the transmission system 3 and the timing of obtaining the echo signal by the reception system 4 are controlled by a predetermined pulse sequence which is determined by an imaging method through the sequencer 6.

Respective embodiments of the fat-suppressed imaging method using the MRI device of the present invention will be described as below. The fat-suppressed imaging method of the present invention suppresses signals from a fat tissue by controlling the amount of longitudinal magnetization of protons of the fat tissue to zero or a desired value under application of a first RF pulse of the main imaging sequence unit. In the embodiment 1 described below, the amount of the longitudinal magnetization of the protons of the fat tissue is controlled to zero. In the embodiment 2, the amount of the longitudinal magnetization of the protons of the fat tissue is controlled to a desired value.

Embodiment 1

An embodiment 1 of a fat-suppressed imaging method using the MRI device of the present invention.

Figure 2:
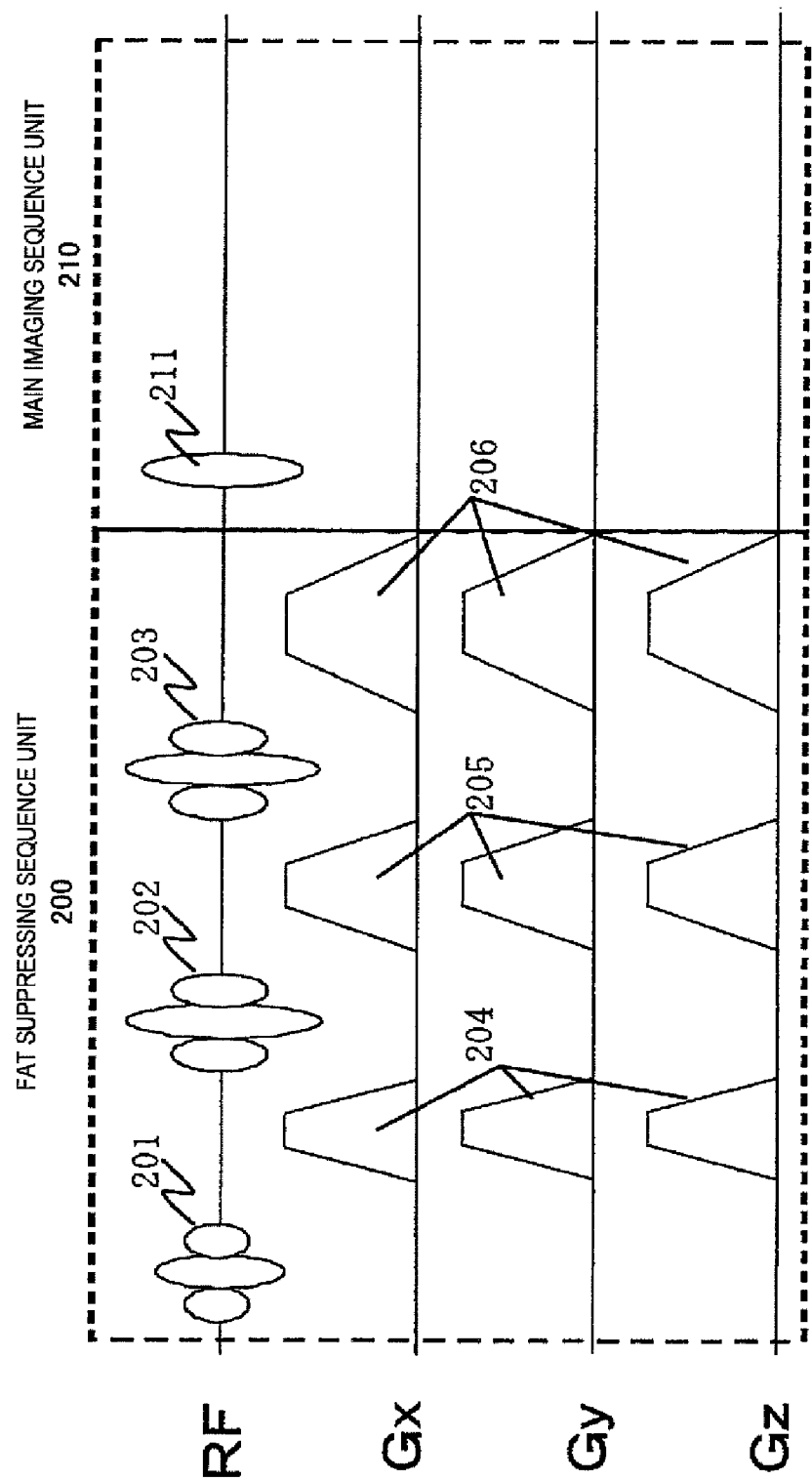
FIG. 2 is a diagram showing a pulse sequence for fat-suppressed imaging according to an embodiment 1.

FIG. 2 shows a pulse sequence for fat-suppressed imaging according to this embodiment. In FIG. 2, RF and axes of Gx, Gy, Gz represent the application timings of RF pulse and the gradient magnetic field pulses.

As shown in FIG. 2, the pulse sequence of the fat-suppressed imaging comprises a fat suppressing sequence unit 200 and a main imaging sequence unit 210. The main imaging sequence unit 210 is not limited to a specific one insofar as it is a general imaging pulse sequence of applying RF pulse 211 to excite spins and obtains an echo signal used for image reconstruction. For example, it comprises a well-known gradient echo type sequence or a high-speed imaging pulse sequence such as EPI, FSE or the like. Accordingly, in FIG. 2, only the RF pulse 211 is shown, and the gradient magnetic field pulse, pulse sequences subsequent thereto such as echo signal measurement, etc. are omitted.

It may be possible not to execute the fat suppressing sequence unit 200 every one repeat Tr (the application interval of the first RF pulse in the main imaging sequence unit 210), but to execute the fat suppressing sequence unit 200 every plural Trs (a plurality of main imaging sequence units 210). The fat suppressing effect is slightly lower than the execution of the fat suppressing sequence unit 200 every repeat Tr, however, some of the fat suppressing sequence unit 200 can be omitted, so that the time efficiency can be enhanced and the fat-suppressed imaging can be performed at high speed.

The fat suppressing sequence unit 200 in this embodiment comprises plural CHESS pulses and a spoiler gradient magnetic field applied subsequently to each CHESS pulse. In the example of the figure, three CHESS pulses 201, 202 and 203 and three spoiler gradient magnetic field pulses 204, 205 and 206 subsequent to the respective CHESS pulses are shown. The CHESS pulses 201, 202, 203 are selecting exciting pulses for selectively exciting only predetermined spins. In this case, these CHESS pulses are set to the same frequency as the resonance frequency of the hydrogen proton (hereinafter referred to as fat spin) in the fat tissue, and only the hydrogen protons in the fat tissue can be selectively excited. In general, the resonance frequency is dependent on the magnetostatic field amplitude, and a frequency calculated in accordance with the magnetostatic field amplitude is set.

The number of the CHESS pulses is equal to three in FIG. 2. However, it may be equal to two or more, and it is properly determined in accordance with the degree of non-uniformity of irradiation magnetic field generated by one CHESS pulse or the like. More specifically, when protons of fat tissue are selectively excited by the CHESS pulse, the spatial non-uniformity of the selective excitation is dependent on the spatial non-uniformity of the high-frequency magnetic field amplitude generated by one CHESS pulse and the spatial non-uniformity of the magnetostatic field in which the examinee is disposed. The distribution of the spatial non-uniformity of the selective excitation by one CHESS pulse which is dependent on these spatial non-uniformity may be measured on the basis of data measured by using phantom or the like in advance, or may be successively measured from actual measurement data under the state that the examinee is disposed in the device every time the examinee as an imaging target is changed.

However, it is expected that as the degree of the spatial non-uniformity of the selective excitation of the protons of the fat tissue by the CHESS pulse (hereinafter referred to as "irradiation magnetic field non-uniformity) is larger, it is necessary to increase the number of CHESS pulses to enhance the effect of suppressing the non-uniformity. In this case, the time of the fat suppressing sequence unit 200 is long, so that the overall imaging time containing the main imaging sequence unit is extended. Accordingly, it is proper that the number of CHESS pulses is equal to 2 to several.

For example, if the degree of the irradiation magnetic field non-uniformity is less than +/−30%, the number of CHESS pulses may be set to 2 pulses. If it is less than +/−50%, the number of CHESS pulses may be set to 3 pulses, and if it is equal to or more +/−50%, the number of CHESS pulses may be set to 4 pulses.

The number of CHESS pulses may be changed in accordance with the permitted time of the fat suppressing sequence unit 200. The time of the fat suppressing sequence unit 200 is also determined by the required time of the main imaging sequence unit 210, and it is equal to the time obtained by subtracting the time of the main imaging sequence unit 210 from the overall imaging time. When the application interval of the fat suppressing sequence unit 200 is short, it is necessary to reduce the number of CHESS pulses.

Furthermore, the flip angles of the CHESS pulses 201, 202, 203 in this embodiment are optimized so that the longitudinal magnetization of the fat spin is substantially equal to zero under application of the first RF pulse (211) in the main imaging sequence unit 210. It will be described later how to determine the optimum values of the flip angles.

The spoiler gradient magnetic field 204, 205, 206 in FIG. 2 is the gradient magnetic field for dispersing the phase of spins (excited spins) which are tilted at a predetermined flip angle under application of the CHESS pulses 201, 202, 203. However, in this embodiment, the spoiler gradient magnetic field is applied every application of the CHESS pulses (201 to 203) with respect to the gradient magnetic field in each of the three directions as shown in FIG. 2. Furthermore, the application amount of the spoiler gradient magnetic field (the area of the portion surrounded by the waveform of the gradient magnetic field and the time axis) is set so that that of the second spoiler gradient magnetic field 205 is different from that of the first spoiler gradient magnetic field 204 and that of the third spoiler gradient magnetic field 206 is different from that of the second spoiler gradient magnetic field 205. For example, the second spoiler gradient magnetic field 205 is set to be twice as large as the first spoiler gradient magnetic field 204 and the third spoiler gradient magnetic field 206 is set to be twice as large as the second spoiler gradient magnetic field 205. By making the application amount of the spoiler gradient magnetic field different from the application amount of the spoiler gradient magnetic field applied just before as described above, it can be suppressed that interfere echo occurs due to continuously applied CHESS pulses and thus unnecessary artifact appears on an image generated by the main imaging sequence unit.

Next, the flip angle of the CHESS pulse will be described. In this case, it will be described by exemplifying a case where the number of CHESS pulses is equal to three.

In this embodiment, the flip angles and the application intervals of the CHESS pulses 201, 202 and 203 are determined so that the longitudinal magnetization of the fat spin is equal to zero under application of the first RF pulse in the main imaging sequence unit 210 and also the longitudinal magnetization of the fat spin is spatially as substantially equal to zero as possible under application of the first RF pulse in the main imaging sequence unit 210 even when the selective excitation of the protons of the fat tissue by each CHESS pulse has some degree of spatial non-uniformity (hereinafter referred to as "the selective excitation of the fat tissue has non-uniform"). That is, the flip angles of the respective CHESS pulses 201, 202, 203 are represented by $\theta_1$, $\theta_2$ and $\theta_3$, and respective pulse intervals (the interval between the CHESS pulses 201 and 202, the interval between the CHESS pulses 202 and 203 and the interval between the CHESS pulse 203 and the exciting pulse 211 which is first applied in the main imaging sequence unit 210) are represented by $\tau_1$, $\tau_2$ and $\tau_3$, the longitudinal magnetization $M(3)$ of the fat spin just before the exciting pulse 211 is applied is determined as a function containing the flip angles $\theta_1$, $\theta_2$ and $\theta_3$ and the pulse intervals $\tau_1$, $\tau_2$ and $\tau_3$ as variables. Furthermore, the flip angles $\theta_1$, $\theta_2$ and $\theta_3$ and $\tau_1$, $\tau_2$ and $\tau_3$ are determined so as to satisfy a first condition that the longitudinal magnetization of the fat spin is substantially equal to zero ($M(3) \cong 0$) under the application of the first RF pulse in the main imaging sequence unit 210 and a second condition that the variation of $M(3)$ is equal to or less than a predetermined threshold value even when the selective excitation of the fat tissue has some degree of non-uniformity.

Furthermore, with respect to plural CHESS pulses of the fat suppressing sequence unit 200, when the overall flip angle is varied with keeping the ratio of the flip angles thereof, a combination of the flip angles as a whole can be properly set in accordance with the feature of the non-uniformity of the irradiation magnetic field. For example, in a case where the plural CHESS pulses have respective flip angles, under the state that the variation of M(3) is equal to or less than a predetermined threshold value when the non-uniformity of the selective excitation of the fat tissue ranges from +40% to −40%, by setting the intensity of each of the plural CHESS pulses to a low level with keeping the ratio of the flip angles of the plural CHESS pulses, the variation of M(3) can be set to be equal to or less than the predetermined threshold value even when the non-uniformity concerned ranges from +60% to −20%. That is, the proper combination of the intensities (flip angles) of the plural CHESS pulses can be determined in accordance with the characteristic of the non-uniformity of the irradiation magnetic field.

Next, an example of a method of interactively determining the flip angle of each CHESS pulse constituting the fat suppressing sequence unit by an operator will be described.

First, when a longitudinal relaxation time of magnetization of fat spin is represented by T1 and the initial longitudinal magnetization (at the start time of the fat suppressing pulse sequence unit) is represented by M(0), the longitudinal magnetization M(3) of the fat spin just before the RF pulse 211 is applied can be represented as follows.

First, The residual longitudinal magnetization M(1) after the first CHESS pulse 201 is applied and just before the next CHESS pulse 202 is applied can be represented by the following equation (1).

{Equation 1}

$$M(1) = 1 - (1 - M(0) \times \cos\theta 1) \times \exp(-\tau 1/T1) \quad (1)$$
$$= M(0) \times \cos\theta 1 \times \exp(-\tau 1/T1) + (1 - \exp(-\tau 1/T1))$$

Here, in the equation (1), θ1 represents the flip angle of the CHESS pulse 201, and τ1 represents the time from the end of application of the CHESS pulse 201 till application of the CHESS pulse 202.

Next, the residual longitudinal magnetization M(2) of the fat spin after the second CHESS pulse 202 is applied and just before the next CHESS pulse 203 is applied can be represented by the following equation (2).

{Equation 2}

$$M(2) = 1 - (1 - M(1) \times \cos\theta 2) \times \exp(-\tau 2/T1) \quad (2)$$
$$= M(0) \times \cos\theta 1 \times \cos\theta 2 \times \exp(-(\tau 1 + \tau 2)/T1) + (1 - \exp(-\tau 1/T1)) \times \cos\theta 2 \times \exp(-\tau 2/T1) + (1 - \exp(-\tau 2/T1))$$

In the equation (2), θ2 represents the flip angle of the CHESS pulse 202, and τ2 represents the time from the end of the CHESS pulse 202 till application of the CHESS pulse 203.

Furthermore, the residual longitudinal magnetization M(3) of the fat spin under application of the first RF pulse in the main imaging sequence unit 210 after application of the third CHESS pulse 203 can be represented by the following equation (3).

{Equation 3}

$$M(3) = 1 - (1 - M(2) \times \cos\theta 3) \times \exp(-\tau 3/T1) \quad (3)$$
$$= M(0) \times \cos\theta 1 \times \cos\theta 2 \times \cos\theta 3 \times \exp(-(\tau 1 + \tau 2 + \tau 3)/T1) + (1 - \exp(-\tau 1/T1)) \times \cos\theta 2 \times \cos\theta 3 \times \exp(-(\tau 2 + \tau 3)/T1) + (1 - \exp(-\tau 2/T1)) \times \cos\theta 3 \times \exp(-\tau 3/T1) + (1 - \exp(-\tau 3/T1))$$

M(0) is approximately represented by the equation (4) when the application interval of the fat suppressing sequence is represented by Tr. In the case of multi-slice imaging, Tr is represented by Tr=TR/MS, wherein TR represents the RF pulse application interval (repeating time) for slice selection at a specific slice position and MS represents the number of slices. If TR and MS are set as imaging parameters, Tr is a uniquely determined parameter.

{Equation 4}

$$M(0) = 1 - \exp(-Tr/T1) \quad (4)$$

Here, when the pulse intervals $\tau_1$, $\tau_2$ and $\tau_3$ are considered as the fixed minimum times determined by the minimum pulse application time and the minimum spoiler gradient magnetic field application time which are determined on the basis of the requirement of the frequency selectivity of the CHESS pulse in the fat suppressing sequence, M(3) is a function containing only the flip angles $\theta_1$, $\theta_2$ and $\theta_3$ as variables.

In this embodiment, an example of a method of interactively determining the flip angle of each CHESS pulse constituting the fat suppressing sequence unit by the operator will be described.

First, a three-dimensional map of values of M(3) in which the flip angles of the first to third CHESS pulses (201 to 203) are set to the three axes is created by using the equation (3), and variation of M(3) is examined while each angle is varied within a predetermined range on the three-dimensional map.

The operator finds out on the three-dimensional map an area in which a region where the longitudinal magnetization (3) of the lipid component is equal to or less than a predetermined threshold value under application of the first CHESS pulse in the main imaging sequence over a broad range of the flip angle of each CHESS pulse is as broad as possible, and selects the optimum value of the flip angle of each CHESS pulse within the area concerned.

Figure 3:
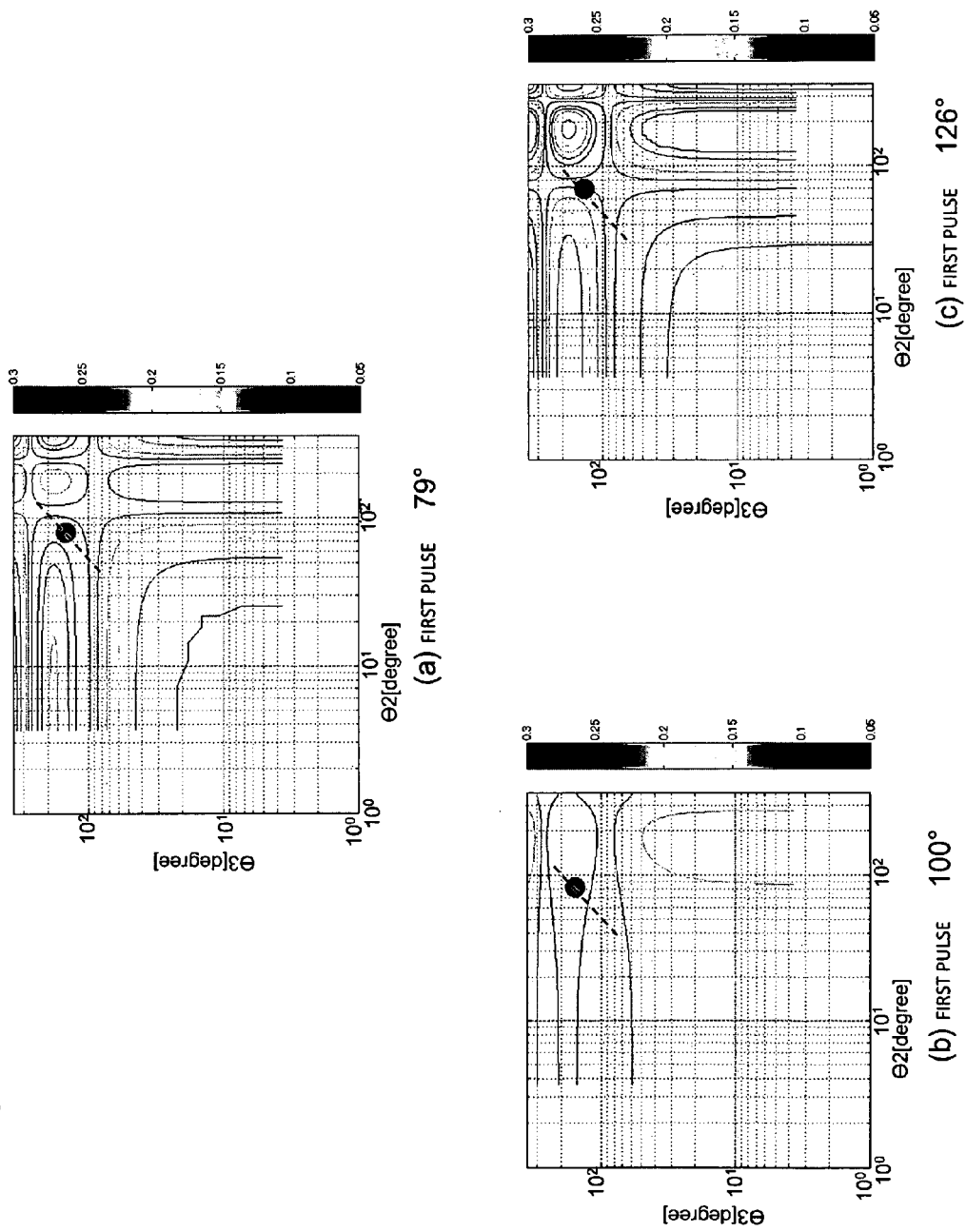
FIG. 3 is a map in which values of longitudinal magnetization M(3) are plotted.

Specifically, for example, CPU 7 varies and fixes the flip angle θ1 of the first CHESS pulse at a fixed interval in the range from 1 to 180°, creates a map in which the values of the longitudinal magnetization M(3) of the lipid component are plotted at each θ1 on the two-dimensional space in which the abscissa axis is set to the flip angle θ2 of the second CHESS pulse and the ordinate axis is set to the flip angle θ3 of the third CHESS pulse, and displays the map on the display 27. The operator views the overall map, and first finds out a map of some θ1 containing an area in which a region where M(3) is equal to a predetermined threshold value or less is as broad as possible. Next, by referring to maps of θ1 which are preceding and subsequent to the found-out map of θ1, the operator finds out both areas of the preceding and subsequent maps where the longitudinal magnetization M(3) is equal to the predetermined threshold value or less are as broad as possible. As described above, a rough optimum flip angle of each CHESS pulse is found out. FIGS. 3(*a*)(*b*)(*c*) show maps in the case of θ1=79°, 100° and 126°. According to these maps, the area where M(3) is equal to the predetermined threshold value or less is as broad as possible in the neighborhood of line segments of broken lines passing the positions marked by filled circles.

Figure 13:
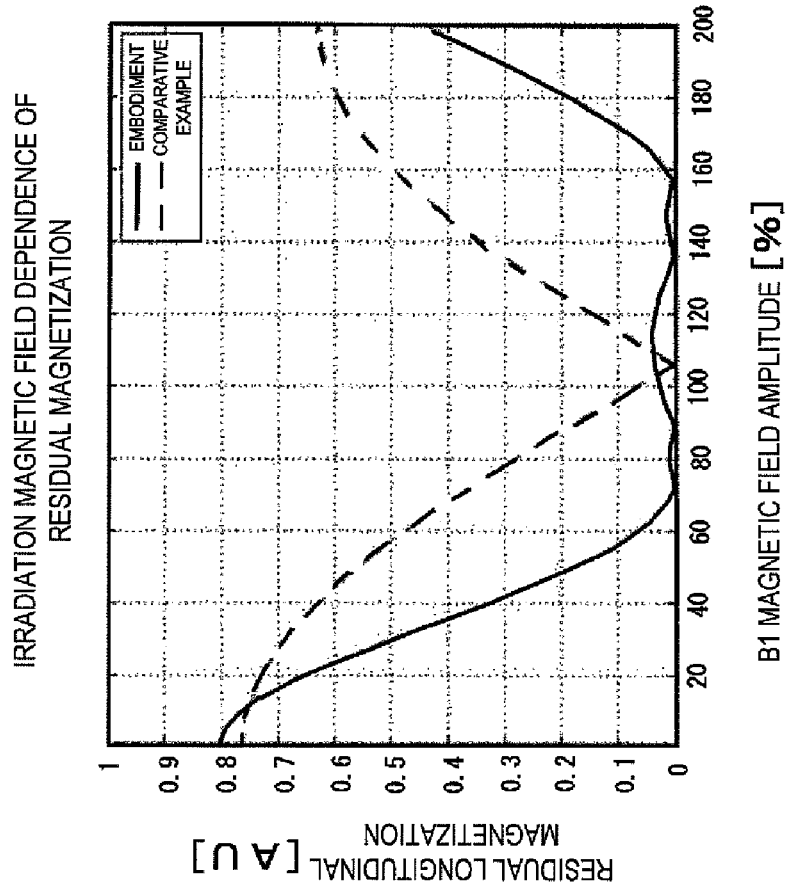
FIG. 13 is a simulation result (solid line) of the irradiation magnetic field amplitude dependency of the longitudinal magnetization amplitude of fat spin when the fat spin is excited by a first combination.

Next, with respect to the fine adjustment of the flip angle of each CHESS pulse, CPU 7 inputs a rough optimum flip angle of each CHESS pulse into the equation (3), creates a graph (as shown in FIG. 13 described later) in which a coefficient for varying the intensity of each CHESS pulse is varied on the line segment indicated by the broken line (for example, in the range from 10% to 200% in terms of Amp) is set to the ordinate axis and the ordinate axis is set to the longitudinal magnetization M(3) of the lipid component, and finely adjusts the graph so that an area where the longitudinal magnetization M(3) of the graph keeps a desired value is as flat and broad as possible. In this case, the line segments indicated by the broken lines are set so that the gradients thereof are equal to 1 in the log scale (graphs in which the abscissa and ordinate axes are represented by logarithm), for example. By determining the optimum value of the combination of the three flip angles on the line segments whose gradients are equal to 1 in the log scale, the effect of the non-uniformity of the irradiation magnetic field can be optimally estimated when the effect of the non-uniformity of the irradiation magnetic field is dependent in proportion to each flip angle.

The thus-determined optimum flip angle construction in which $M(3) \cong 0$ corresponds to the construction that the first CHESS pulse has a flip angle of 117°, the second CHESS pulse has a flip angle of 77° and the third CHESS pulse has a flip angle of 180°, for example. In the above calculation, the pulse intervals $\tau1$, $\tau2$ and $\tau3$ of the three pulses are set to 17 msec, 17 msec and 13 msec respectively and the application interval Tr of the pulse sequence is set to 250 msec (T1 value of general fat when the amplitude of the magnetostatic field is set to 1.5 T).

The processing described above corresponds to an example of the method of interactively determining the flip angle of each CHESS pulse constituting the fat suppressing sequence unit by the operator.

According to the above embodiment, in the fat suppressing imaging provided with the fat suppressing sequence unit 200, the flip angle of each CHESS pulse is optimized by using plural CHESS pulses. Therefore, even when the spatial amplitude of the high-frequency magnetic field in which the CHESS pulse occurs is non-uniform or the magnetostatic field in which the examinee is disposed is spatially non-uniform, the effect thereof can be minimized, and the adjustment is performed so that the longitudinal magnetization of fat spin is spatially uniformly equal to zero under application of the first RF pulse in the main imaging sequence unit 210, and an excellent image in which the fat spin is suppressed in all the spatial areas can be obtained.

Furthermore, according to this embodiment, the application amount of the spoiler gradient magnetic field applied after the CHESS pulse is applied is made different from the application amount of the spoiler gradient magnetic field applied just before CHESS pulse is applied, whereby it can be suppressed that an interference echo occurs due to continuously applied CHESS pulses and unnecessary artifact appears on the image.

According to this embodiment, it is unnecessary to await recovery of longitudinal magnetization until the imaging sequence is started as in the case of use of an adiabatic pulse disclosed in Non-patent document 1, and thus the time of the fat suppressing sequence unit 200 can be shortened. As a result, the fat-suppressed imaging operation can be performed without lengthening the imaging time as a whole.

Non-patent Document 1: Design of Adiabatic Pulses for Fat-Suppression Using Analytic Solutions of the Bloch Equation, MRM 37: 797-801

According to this embodiment, as compared with the case where the adiabatic pulse described in the Non-patent document 1 is used, the absorption amount (SAR) of the high-frequency magnetic field into the living body is reduced. The reason resides in that as compared with the method based on the adiabatic inverting pulse described in the Non-patent document 1 in which the normal irradiation time is long and SAR may be increased, in this embodiment, three sinc pulses are used, and the respective sinc pulses have, for example, 5 lobes, an application time of about 10 msec and pulse intensities of 117°, 77° and 180° and can be constructed by the same pulse combination as the RF pulses used for a general pulse sequence, so that SAR can be reduced. Particularly, in the case of an MRI device in which the magnetostatic field amplitude is equal to 3 T and which has been recently promoted to be developed, the applied high frequency magnetic field is high and thus it has been strongly required to reduce SAR. That is, the technique described in this embodiment is effective to an MRI having a magnetostatic field generating source for generating magnetostatic field having high amplitude.

Embodiment 2

Next, an embodiment 2 of the present invention will be described. The embodiment 2 is the same as the embodiment 1 described above in that plural CHESS pulses are used in the fat suppressing sequence unit 200, and different from the embodiment 1 in that the application interval of the plural CHESS pulses (or one of plural application intervals between plural CHESS pulses) is controlled and determined so that the longitudinal magnetization of the fat spin is equal to a desired value under application of the first RF pulse in the main imaging sequence unit 210 and also the longitudinal magnetization of the fat spin is substantially spatially uniformly equal to a desired value even when some degree of non-uniformity occurs in the irradiation magnetic field. More specifically, in order to set the longitudinal magnetization of the fat spin to a desired value, the time interval between the last CHESS pulse and the CHESS pulse just before the last CHESS pulse in the fat suppressing sequence unit 200 is controlled. The other matters are the same as the embodiment 1. The description on the common portions to the embodiment 1 is omitted, and only the different portions will be described in detail as below.

Figure 4:
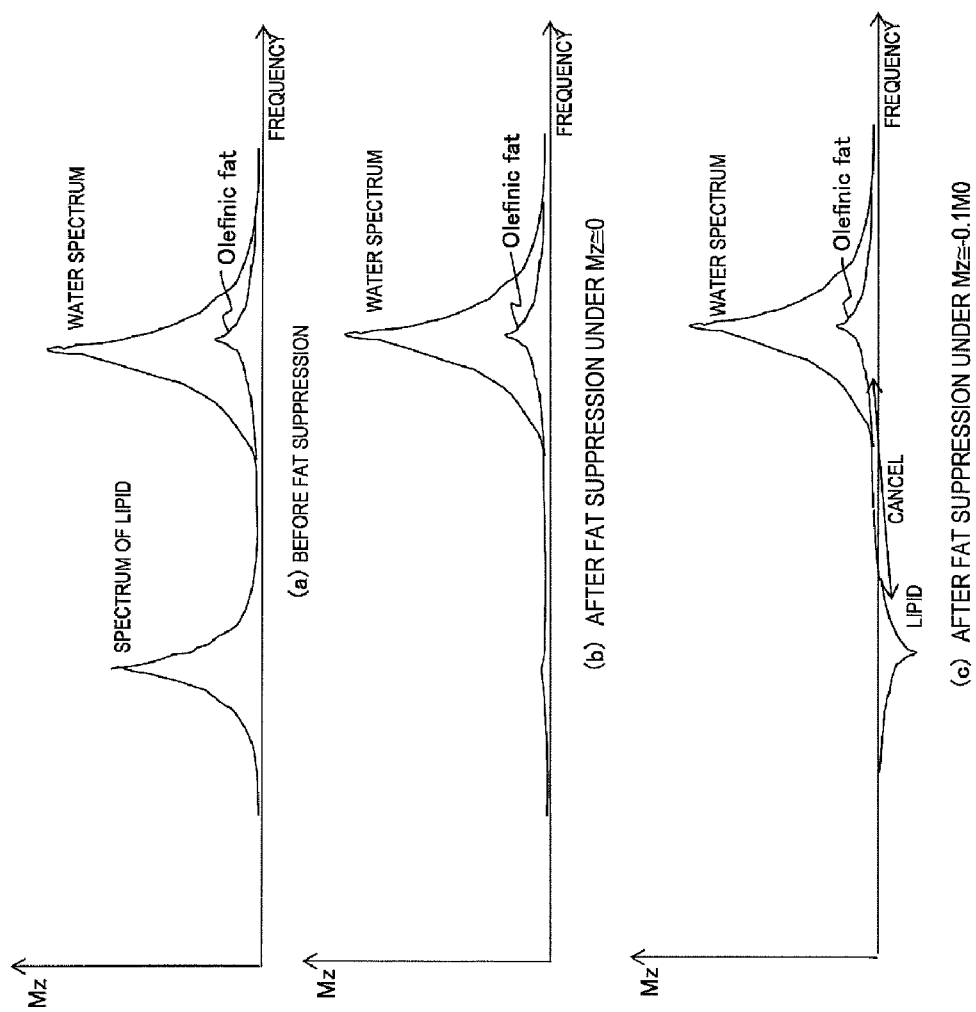
FIG. 4 is a diagram showing a frequency spectral distribution of water and a lipid component.

In order to describe this embodiment, a prior art described in a non-patent document 2 (hereinafter referred to as first method) for canceling a signal from a fatty acid type lipid component (Olefinic Fat) having substantially the same resonance frequency as the resonance frequency of hydrogen protons in water molecules will be described with reference to FIG. 4. FIG. 4(*a*) is a diagram showing frequency spectral distributions of water and the lipid component. In such a case, by general fat suppression based on one CHESS pulse, that is, the excitation of nullifying the longitudinal magnetization (3) of only a normal lipid component (a component of fat appearing at a frequency position far away from the water spectrum), the longitudinal magnetization of Olefinic fat remains, and thus the fat suppression is incomplete. On the other hand, in the prior art disclosed in the Non-patent Document 2, as shown in FIG. 4(*c*), the longitudinal magnetization of the normal lipid component which is selectively excited by one CHESS pulse is partially inverted and set to a desired value in accordance with the ingredient amount of Olefinic fat having the same resonance frequency as water molecules. The fatty acid type lipid component (Olefinic fat component) is generally contained by about 0.05 to 0.1 when the lipid component is assumed to be 1. Accordingly, for example, the longitudinal magnetization M(3) of the fat spin under application of the first RF pulse in the main imaging sequence unit 210 may be set to M(3)≅−0.1 M0 (M0 represents the initial value of magnetization of the normal lipid component) or the like. Accordingly, when an echo signal is obtained in the main imaging sequence unit 210, the signals of the partially inverted lipid component and the Olefinic fat component are cancelled out with each other, and all the fatty tissue containing the Olefinic fat component can be suppressed.

Non-patent Document 2: Optimization of Chemical Shift selective Suppression of Fat. MRM40: 505-510 (1998)

Alternatively, according to a prior art described in Non-patent document 3 for canceling a signal from a fatty acid type lipid component (Olefinic Fat component) (hereinafter referred to as second method), the normal lipid component is excited by one CHESS pulse so that only the magnetization amount as Olefinic fat slightly remains in the same magnetization direction as the Olefinic Fat component. In this main imaging sequence, the application timing of the signal reading gradient magnetic field is displaced and set so that the normal lipid component and the Olefinic Fat component are out of phase (that is, the phases thereof are different from each other by 180°) when the echo signals thereof are obtained. Accordingly, the signal caused by the Olefinic Fat component is canceled out, and all the fat tissue containing the Olefinic Fat component can be suppressed.

On the other hand, when the time interval τ2 is gradually shortened from the time interval τ2 of the state shown in FIG. 7(a), the absolute value of the longitudinal magnetization M(3) increases in the plus direction from M(3)≅+0.1 to M(3)≅+0.2 as shown in FIG. 7(d) and FIG. 7(e). That is, the flip angle of the longitudinal magnetization of the excited lipid component is equal to 90° or less, and the lipid component is excited in the same direction as Olefinic fat to the extent that the magnetization amount slightly remains. The flip angle is smaller as the time interval τ2 is changed to a smaller value. According to FIGS. 7(d) and 7(e), from the fact that the ordinate axis (Residual magnetization M(3)) is kept to a substantially fixed value even when B1 Amplitude "%" of the abscissa axis varies from 60% to 140% in FIGS. 7(d) and 7(e), it is also found that a range in which the value of the longitudinal magnetization M(3) is not greatly varied due to the non-uniformity of the irradiation magnetic field represented by the abscissa axis is substantially fixed irrespective of time interval τ2. That is, the state that the longitudinal magnetization M(3) of the excited lipid component does not suffer any effect of the non-uniformity of the irradiation magnetic field is kept even when τ2 is changed.

The excitation of the lipid component with which the flip angle of the longitudinal magnetization of the lipid component is equal to 90° or less can be also implemented by lengthening the time interval τ3 between the last CHESS pulse of the fat suppressing sequence unit 200 and the first RF pulse of the main imaging sequence unit 210.

Figure 8:
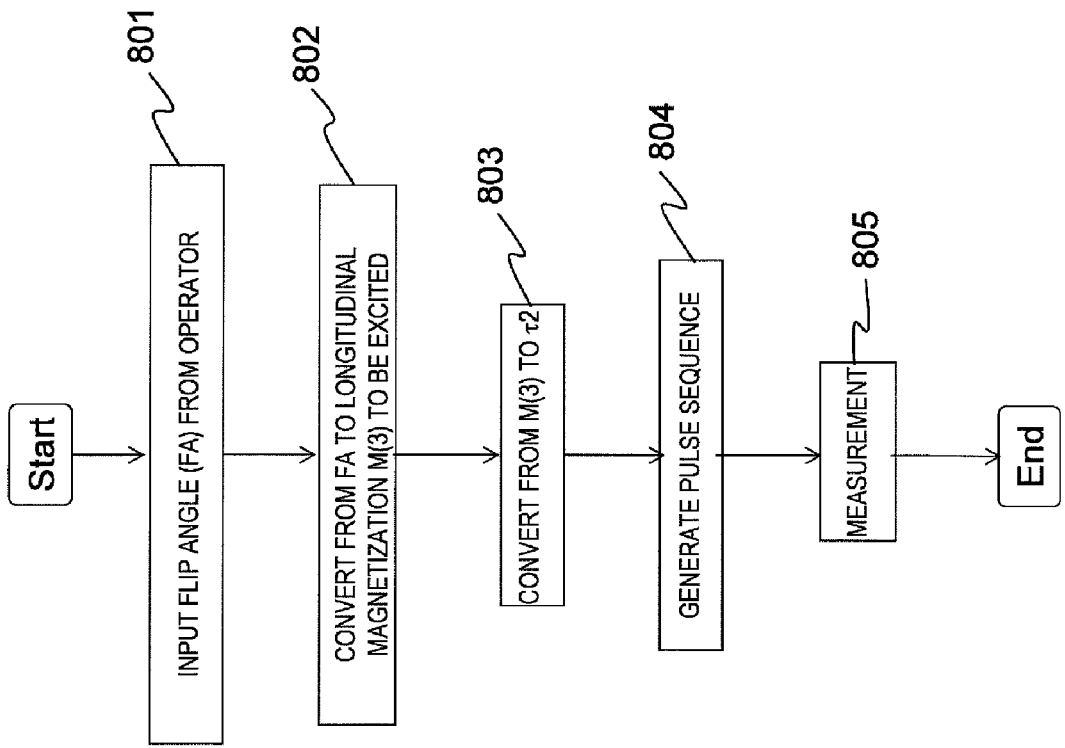
FIG. 8 is a diagram showing an example of the processing flow of setting the longitudinal magnetization M(3) of the lipid component to a desired value, that is, a desired flip angle.

Next, an example of the processing flow of setting the longitudinal magnetization M(3) of the lipid component to a desired value, that is, a desired flip angle will be described with reference to FIG. 8. The processing flow shown in FIG. 8 is stored as a program in ROM 21 in advance, and the program is read out and executed by CPU 7 to execute the processing flow. The details of each processing step will be described hereunder.

In step 801, a value to which the longitudinal magnetization M(3) of the lipid component is excited under application of a first RF pulse of the main imaging sequence unit is input in terms of the flip angle (FA) into an input screen. The input screen is displayed on the display 27. The operator inputs the longitudinal magnetization M(3) of the lipid component by using the flip angle (FA) through peripheral equipment such a keyboard, a mouse, etc. on the input screen. If the first method described above (the technique described in the non-patent document 2) is used, the flip angle (FA) is set to 90° or more, and if the second method described above (the technique described in the non-patent document 3) is used, the flip angle (FA) is set to 90° or less.

In step 802, CPU 7 determines the longitudinal magnetization M(3) after the excitation on the basis of the input flip angle (FA). Specifically, the longitudinal magnetization M(3) after the excitation is determined as follows:

{equation 5}

$$M(3)=\cos(FA) \quad (5)$$

Figure 6:
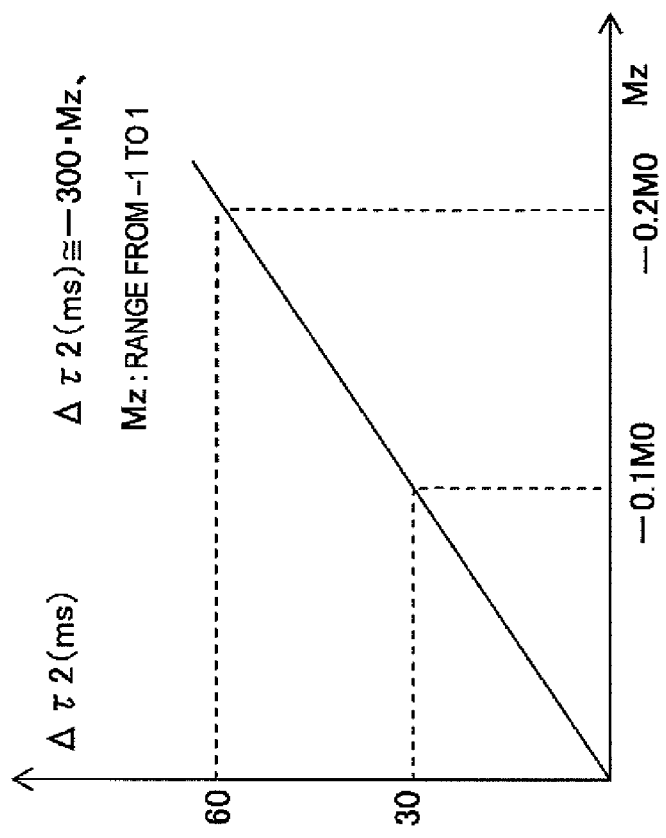
FIG. 6 is a diagram showing an example of the relationship between the change of the time interval τ2 and the longitudinal magnetization M(3) of the normal lipid component under application of the first RF pulse in the main imaging sequence unit 210 in the embodiment 2.

In step 803, CPU 7 determines the time interval τ2 between the last CHESS pulse and the preceding CHESS pulse just before the last CHESS pulse in the fat suppressing sequence unit 200 on the basis of the longitudinal magnetization M(3) after the excitation determined in step 802. τ2 is determined by using an equation (7) obtained by setting M(3)=cos(FA) in the following equation (6) to calculate τ2. The calculation of the value of the time interval τ2 based on the longitudinal magnetization M(3) after the excitation may be performed by utilizing the linear relation between the longitudinal magnetization M(3) and the change amount Δτ2 of the time interval and determining the change amount Δτ2 of the time interval dependently on the longitudinal magnetization M(3) as shown in FIG. 6.

In step 804, CPU 7 generates the fat suppressing sequence unit 200 by using the time interval τ2 determined in step 803, joins the fat suppressing sequence unit 200 to a desired main imaging sequence unit 210 to generate a pulse sequence, and notifies the information of the generated pulse sequence to the sequencer 6.

In step 805, the sequencer 6 executes the measurement of an echo signal by using the pulse sequence generated in step 804. That is, the fat suppressing sequence unit 200 of the pulse sequence excites the longitudinal magnetization M(3) of the lipid component to a desired value, and under this state, an echo signal used for the image reconstruction is measured by the subsequent main imaging sequence unit 210. If the second method described above is used, the application timing of the signal reading gradient magnetic field is displaced and set so that the normal lipid component and the Olefinic Fat component are out of phase when the echo signals thereof are obtained (that is, the phases thereof are different from each other by 180°). Accordingly, both the signal from the normal lipid component and the signal from the Olefinic Fat component are suppressed, and also the suppressing degree (particularly, the spatial uniformity of suppression) is also higher than those of the non-patent document 2 and the non-patent document 3.

As in the case of the embodiment 1, even when the irradiation magnetic field is non-uniform, the effect thereof is minimized, and the longitudinal magnetization of the fat spin substantially under application of the first RF pulse in the main imaging sequence unit 210 is adjusted to be spatially uniformly equal to a desired value, thereby obtaining an excellent image in which the fat spin is suppressed in all the areas.

Through the processing flow described above, the longitudinal magnetization M(3) of the fat is excited to the desired value and the echo signal is measured.

Next, the calculation expression of determining the time interval τ2 on the basis of a desired value of the longitudinal magnetization M(3) will be described with reference to FIG. 5.

According to the Broch equation, when the longitudinal magnetization M(3) is disturbed from the equilibrium state by excitation based on RF pulse, it relaxes with some time constant (T1 relaxation time) and returns to the equilibrium state before the excitation. Here, the flip angles of the respective CHESS pulses (201 to 203 in FIG. 2) are represented by α1, α2, α3, and the pulse intervals are represented by τ1, τ2, τ3.

At this time, the equation (3) in the embodiment 1 is changed to the following equation (6) in this embodiment.

{equation 6}

$$\begin{aligned} M(3) &= 1 - (1 - M(2) \times \cos\alpha 3) \times \exp(-\tau 3/T1) \\ &= M(0) \times \cos\theta 1 \times \cos\theta 2 \times \cos\alpha 3 \times \\ &\quad \exp(-(\tau 1 + \tau 2 + \tau 3)/T1) + \\ &\quad (1 - \exp(-\tau 1/T1)) \times \cos\alpha 2 \times \cos\alpha 3 \times \\ &\quad \exp(-(\tau 2 + \tau 3)/T1) + \\ &\quad (1 - \exp(-\tau 2/T1)) \times \cos\alpha 3 \times \exp(-\tau 3/T1) + \\ &\quad (1 - \exp(-\tau 3/T1)) \end{aligned} \quad (6)$$

When the desired longitudinal magnetization excited by three CHESS pulses is represented in the terms of the flip angle FA, M(3)=cos(FA) is substituted into the equation (6) and the equation (6), with respect to τ2, is solved, {equation 7}

$$\tau 2 = -T1 \times Ln \left( \frac{\cos(FA) - \cos(\alpha 3) \times \exp\left(-\frac{\tau 3}{T1}\right) - \left(1 - \exp\left(-\frac{\tau 3}{T1}\right)\right)}{M(0) \times \cos(\alpha 1) \times \cos(\alpha 2) \times \cos(\alpha 3) \times \left[\exp\left(-\frac{(\tau 1 + \tau 3)}{T1}\right) + \left(1 - \exp\left(-\frac{\tau 1}{T1}\right)\right)\right] \times \cos(\alpha 2) \times \cos(\alpha 3) \times \exp\left(-\frac{\tau 3}{T1}\right) - \cos(\alpha 3) \times \exp\left(-\frac{\tau 3}{T1}\right)} \right) \quad (7)$$

On the basis of the equation (7), the time interval τ2 between the last CHESS pulse (203 in FIG. 2) and the just preceding CHESS pulse (202 in FIG. 2) of the fat suppressing sequence unit 200 is calculated under the application of the first CHESS pulse of the imaging sequence.

According to the above embodiment, the longitudinal magnetization under application of the first RF pulse of the main imaging sequence unit can be arbitrarily controlled by merely changing one parameter representing the time interval between the CHESS pulses without varying the shape and intensity of each CHESS pulse constituting the fat suppressing sequence unit.

That is, in this embodiment, only one parameter τ2 which is one of variables τ of the time intervals of the CHESS pulses may be changed to excite desired longitudinal magnetization set by the operator under application of the first RF pulse in the main imaging sequence unit. In this embodiment, the calculation of FA→τ2 is also easy like the equation (7), and the change of the pulse sequence is only the change of the time interval between CHESS pulses, so that the mount and control of the fat suppressing sequence unit can be easy.

According to this embodiment, the value of the longitudinal magnetization M(3) of any nuclear specifies can be controlled to a desired value without prolonging the imaging time as in the case of the method using the adiabatic pulse in such a manner that the longitudinal magnetization is little affected by the non-uniformity of the irradiation magnetic field.

The method of this embodiment may be combined with the main imaging sequence unit in the first method and the second method when there is a fatty acid type lipid component (Olefinic Fat) having substantially the same resonance frequency as the resonance frequency of protons in water molecules, and the fat suppressing sequence can be executed without suffering any effect of the non-uniformity of the irradiation magnetic field and prolonging the imaging time as in the case of the method using the adiabatic pulse.

Accordingly, when an image is generated by using a signal from a desired nuclear specifies (normally, protons in water molecules), the fat suppression can be performed spatially uniformly and with high suppression degree.

In this embodiment, the merit that the longitudinal magnetization under application of the first RF pulse of the main imaging sequence unit is represented in terms of the flip angle and the optimum fat suppressing sequence can be easily designed on the basis of the flip angle resides in that the operator can properly select the suppression degree in connection with each imaging case like a case where the above Olefinic Fat is also suppressed or only normal lipid component is purely suppressed. For example, the operator can easily design the fat suppressing sequence in accordance with an operator's desire on the control so that fat is left lightly (intentionally so that the structure can be grasped) or fat is surely suppressed.

Embodiment 3

Next, an embodiment 3 of this invention will be described. This embodiment is different from the embodiment 1 in a method of suppressing that interference echo occurs due to CHESS pulses continuously applied in the fat suppressing sequence and thus unnecessary artifact appears on an image.

Figure 9:
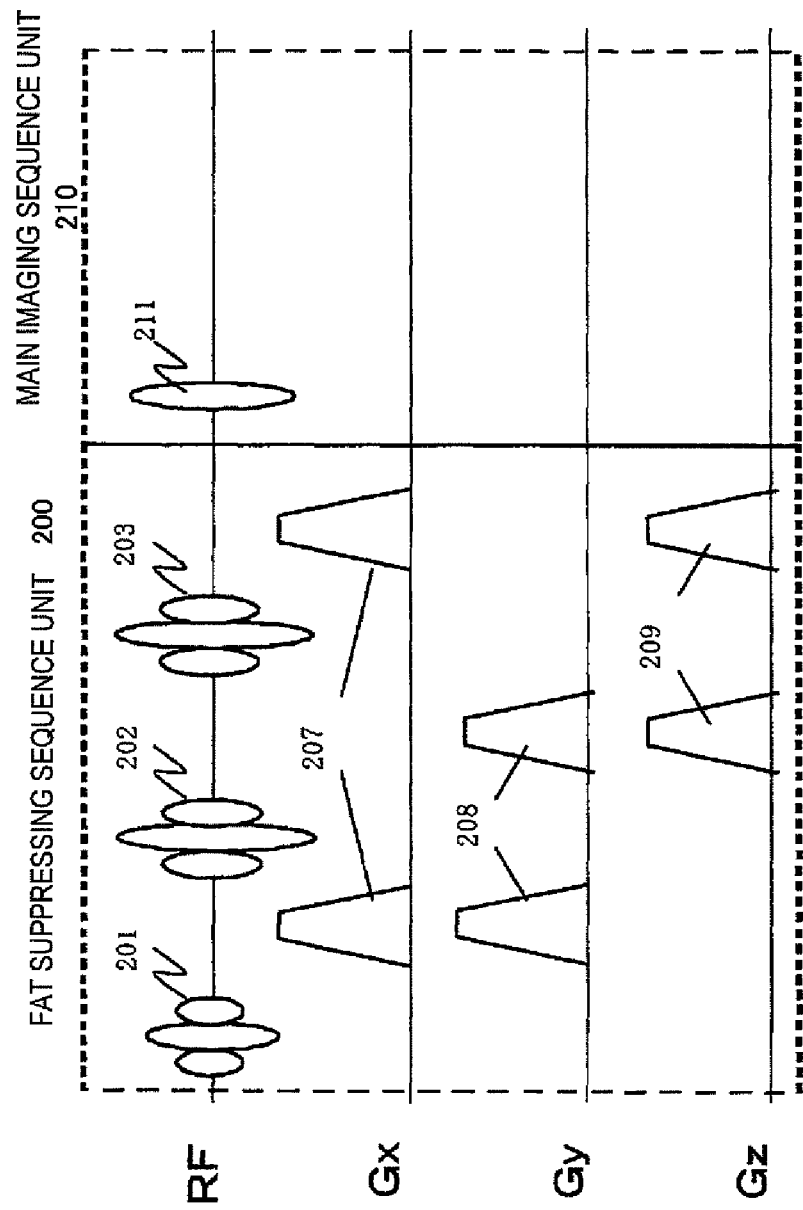
FIG. 9 is a diagram showing a fat suppressing sequence unit 200 of an embodiment 3.

FIG. 9 shows a fat suppressing sequence unit 200 of the embodiment 3.

In this embodiment, as shown in FIG. 9, after a first CHESS pulse 201 is applied, spoiler gradient magnetic field pulses 207 and 208 of two axes out of the three axes of the gradient magnetic field, in this case, the X-axis and the Y-axis are applied. After the second CHESS pulse 202 is applied, the spoiler gradient magnetic field pulses of two axes out of the three axes of the gradient magnetic field are applied, however, the combination of the two axes is different from the just preceding combination of the two axes. For example, as shown in FIG. 9, the spoiler gradient magnetic field pulses 208, 209 of the Y-axis and the Z-axis are applied. Likewise, after the third high-frequency gradient magnetic field pulse is applied, the combination of the spoiler gradient magnetic field pulses is changed and applied. For example, as shown in FIG. 9, the spoiler gradient magnetic field pulses 209 and 207 of the Z-axis and the X-axis are applied.

As described above, in this embodiment, the spoiler gradient magnetic field pulse applied after each CHESS pulse is applied is different from the just preceding spoiler gradient magnetic field pulse, and the application amounts of the spoiler gradient magnetic field of the respective axes in the fat suppressing sequence unit 200 are finally equal to one another. Accordingly, as in the case of the embodiment 1, it can be suppressed that interference echo occurs due to the continuously applied CHESS pulses in the fat suppressing sequence and unnecessary artifact appears on the image. Furthermore, the spoiler gradient magnetic field can be made simple, and thus the load of a power source for gradient magnetic field and noise caused by application of gradient magnetic field pulses can be reduced.

The spoiler gradient magnetic field pulse may be inserted into only one axis between respective CHESS pulses and also the insertion axis of the spoiler gradient magnetic pulse may be changed among the CHESS pulses.

In this embodiment, the flip angles and the application interval of the plural CHESS pulses are optimized as in the case of the embodiments 1 and 2. Accordingly, a higher fat suppressing effect can be obtained as compared with the conventional case where only one CHESS pulse is used, and also the time required for the fat suppressing pulse sequence is shorter as compared with the case where the adiabatic pulse is used, so that the imaging time can be shortened as a whole.

Embodiment 4

Figure 10:
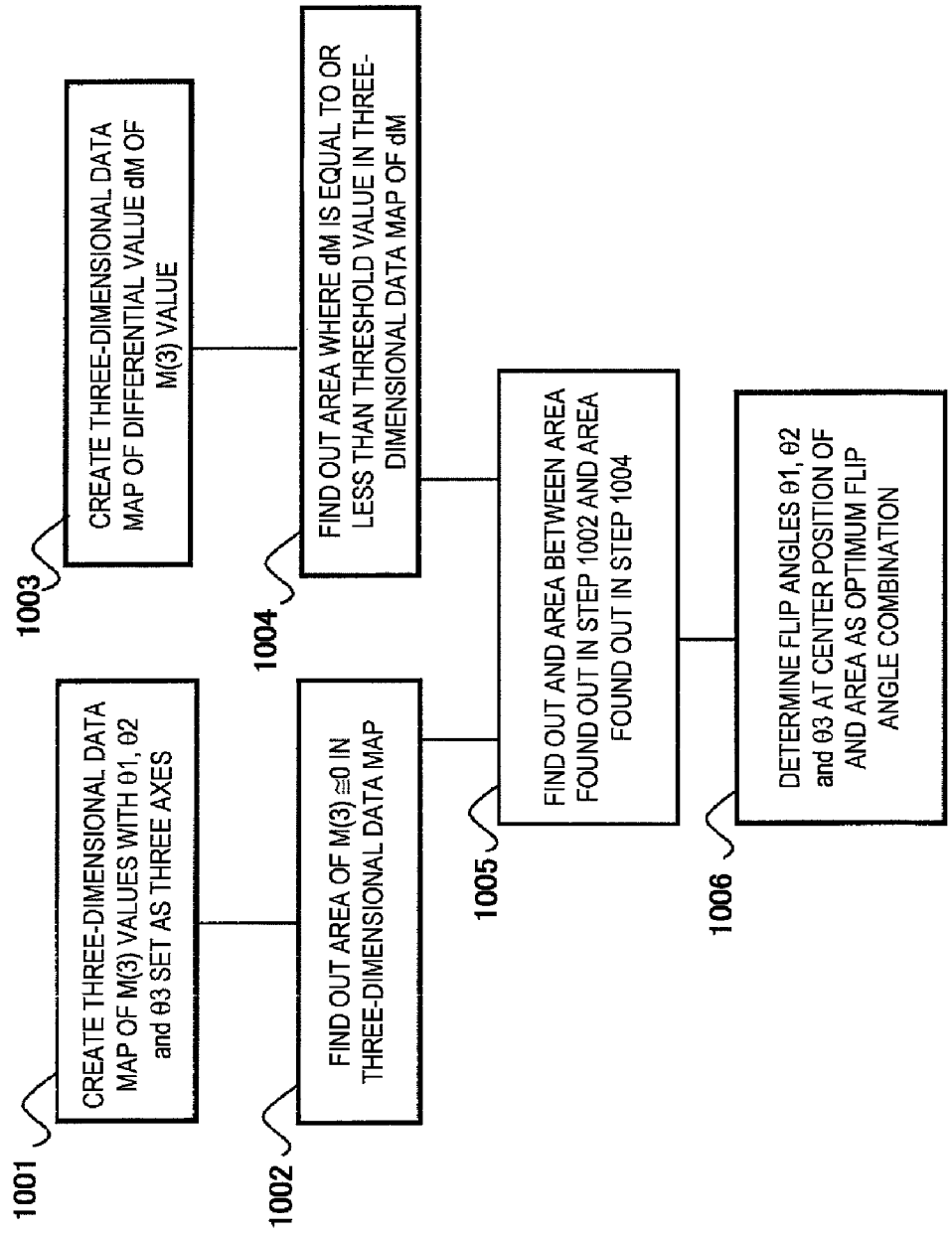
FIG. 10 is a diagram showing the processing flow of an embodiment of determining a combination of optimum flip angles $\theta_1$, $\theta_2$ and $\theta_3$ by an optimizing method based on theoretical simulation.

Next, an embodiment 4 of the fat-suppressed imaging method using the MRI device of the present invention will be described. In this embodiment, the combination of the optimum flip angles $\theta_1$, $\theta_2$ and $\theta_3$ is determined by an optimization method based on theoretical simulation. FIG. 10 shows an example of the processing flow of the optimization method.

This processing flow is stored as a program in RAM 22 in advance, and the program is read out and executed by CPU 7 to execute the processing flow. The details of the respective processing steps will be described.

In step 1001, M(3) is calculated with respect to each value of $\theta_1$, $\theta_2$ and $\theta_3$ according to the equation (3), and a three-dimensional data map of M(3) value with $\theta_1$, $\theta_2$ and $\theta_3$ set as the three axes is created. As described above, when the imaging parameters (the repeat time (Tr), the number of slices (MS), etc.) are set in advance by the operator, each optimum flip angle is calculated under the conditions of the set imaging parameters.

In step 1002, an area of M(3)≅0 (an area determined by $\theta_1$, $\theta_2$ and $\theta_3$) is extracted in the three-dimensional data map created in step 1001.

In step 1003, M(3) in the three-dimensional data map created in step 1001 is differentiated by $\theta_1$, $\theta_2$ and $\theta_3$ to create a three-dimensional data map of the differential values dM of the M(3) values. The differential value dM of the M(3) value represents the variation degree of the M(3) value due to the variation of the flip angle. This means that as the differential value dM is smaller, the variation of the M(3) value due to the variation of the flip angle is smaller, that is, the effect of the non-uniformity of the irradiation magnetic field is less. That is, this means that in an area containing small differential values dM, the longitudinal magnetization of fat can be stably suppressed even when some degree of non-uniformity exists in the irradiation magnetic field.

In step 1004, an area in which dM is equal to or less than a threshold value is extracted in the three-dimensional data map of the differential values created in step 1003. The threshold value is ideally equal to zero, however, a practicable value may be used as the threshold value to extract some degree of area.

In step 1005, a portion (AND area) at which the respective areas extracted in step 1002 and step 1004 are overlapped with one another is extracted.

In step 1006, the flip angles $\theta_1$, $\theta_2$ and $\theta_3$ at the center of the AND area are determined as the combination of the optimum flip angles.

The above processing is an example of the processing flow of determining the combination of the optimum flip angles $\theta_1$, $\theta_2$ and $\theta_3$. In the processing flow described above, the combination of the optimum flip angles $\theta_1$, $\theta_2$ and $\theta_3$ is determined dependently on the imaging parameters set by the operator. However, the imaging condition determined by the imaging parameters set by the operator does not greatly affect the characteristic of the plural CHESS pulses, and thus the combination of the optimum flip angles $\theta_1$, $\theta_2$ and $\theta_3$ can be determined irrespective of the set values of the imaging condition from the operator.

As another example, in place of the method of respectively creating the three-dimensional data maps of the M(3) value and the differential value dM(3) thereof and extracting the optimum area, a evaluation function m represented by the following equation (8) may be defined, and $\theta_1$, $\theta_2$ and $\theta_3$ which provide the minimum m may be searched according to a general optimization calculation method.

{equation 8}

$$m = M(3)(\theta_1\theta_2\theta_3) + \frac{dM(3)}{d\theta}(\theta_1\theta_2\theta_3) \qquad (8)$$

Furthermore, considering that the energy of the high-frequency magnetic field to be irradiated is minimized, $(\theta_1+\theta_2+\theta_3)$ may be multiplied or added to the whole of the right side of the evaluation function m (equation (8) and the optimization calculation executed. That is, even when a solution which minimizes the evaluation function m of the equation (8) or the evaluation function m obtained by multiplying or adding $(\theta_1+\theta_2+\theta_3)$ to the right side of the equation (8) is determined by the optimization calculation method, the fat signal can be substantially suppressed.

For example, FIG. 11 shows an example of each of the two-dimensional data maps of the M(3) value and the differential value dM when the flip angle $\theta_1$ of the first CHESS pulse (201 in FIG. 2) is fixed to 90° and the flip angles $\theta_2$ and $\theta_3$ of the second and third CHESS pulses (202, 203 in FIG. 2) are set as variables. In FIG. 11, the M(3) value is represented by white and black contrast, and a black area 1101 represents an area in which the M(3) value is equal to zero. Furthermore, an expanding area of the black area represents an area where variation of the M(3) value is little and the differential value is small. The area 1101 is extracted in the optimization step 1002 described above, and the area 1102 in which the differential value is small is extracted in step 1004. The flip angle is finally set substantially at the center of the area 1102, and thus even when non-uniformity of the flip angle (non-uniformity of irradiation magnetic field) occurs at some places, the flip angle at which the fat longitudinal magnetization M(3) can be set to substantially zero in the whole imaging area is determined.

The two-dimensional data map is shown in FIG. 11 to make the description simple. However, the same is applied to the three-dimension. Furthermore, in the optimization, a threshold value for cutting out the area 1101 or 1102 may be set in advance so that the optimum flip angle is automatically calculated.

Figure 12:
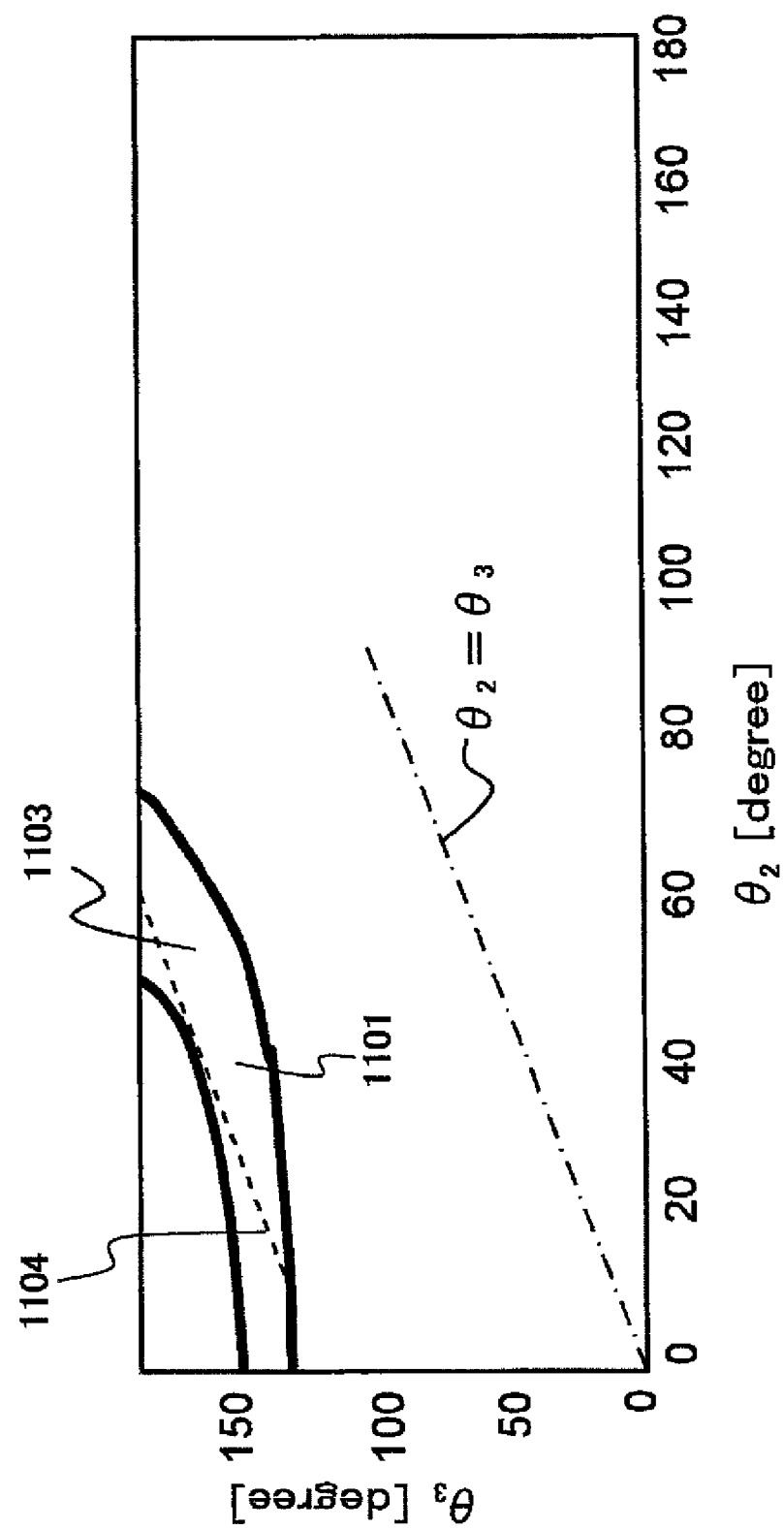
FIG. 12 is a diagram showing an example of a two-dimensional data map of the M(3) value when the flip angle $\theta_1$ is fixed and the flip angles $\theta_2$ and $\theta_3$ of the second and third CHESS pulses 202, 203 are set as variables.

In this embodiment, the differential value of the longitudinal magnetization M(3) is used as an index for indicating the magnitude of the effect of the non-uniformity of the irradiation magnetic field in the combination of the respective flip angles. However, in place of use of the differential value, an index for indicating the degree of breadth of an area in which the longitudinal magnetization M(3) is equal to zero may be used. This will be briefly described by using a two-dimensional data map shown in FIG. 12. FIG. 12 shows a two-dimensional data map of the M(3) value when the flip angle $\theta_1$ is fixed and the flip angles $\theta_2$ and $\theta_3$ of the second and third CHESS pulses 202 and 203 are set as variables as in the case of FIG. 11, and an area 1101 surrounded by a solid line is an area where the M(3) value is equal to zero. In this two-dimensional data map, a position 1103 having the largest width in a direction parallel to a line L satisfying $\theta_2=\theta_3$ of the area 1101 is set as an area for calculating the optimum flip angle.

FIG. 12 shows an example of the two-dimensional case. However, in the case of the three dimension, a width W in a direction parallel to a line L passing through the origin ($\theta_1=0$, $\theta_2=0$ and $\theta_3=0$) and satisfying $\theta_1=\theta_2=\theta_3$ in the area of the longitudinal magnetization M(3)$\cong$0 in the three-dimensional data map may be set as an index, and an area having the largest width W may be set as an area for calculating the optimum flip angle.

As described above, the combination of the optimum flip angles is calculated on the basis of how degree the width in the direction parallel to the line L passing through the origin ($\theta_1=0$, $\theta_2=0$ and $\theta_3=0$) and satisfying $\theta_1=\theta_2=\theta_3$ can be increased. The reason for this is as follows. Assuming that the effect of the non-uniformity of the irradiation magnetic field is uniform in the respective directions of $\theta_1$, $\theta_2$, $\theta_3$ of the three-dimensional map, the effect of $\Delta\theta$ appears in both of the $\theta_2$ direction and the $\theta_3$ direction when the effect of the non-uniformity of the irradiation magnetic field of $\Delta\theta$ appears in the $\theta_1$ direction on the two-dimensional or three-dimensional map. Therefore, it is expected that if an area having a large width is searched along a line (for example, a line indicated by a broken line (1104)) parallel to the line L passing the origin ($\theta_1=0$, $\theta_2=0$ and $\theta_3=0$) and satisfying $\theta_1=\theta_2=\theta_3$, the combination of the flip angles of the three optimum CHESS pulses can be searched so as to be coincident with the feature of the actual non-uniformity of the irradiation magnetic field of the fat suppressing sequence.

On the other hand, the effect of the non-uniformity of the irradiation magnetic field is dependent on the flip angles of $\theta_1$, $\theta_2$, $\theta_3$, and when they have proportionality relation, the combination of the optimum flip angles may be calculated while a large width W can be set on a line which passes through the origin ($\theta_1=0$, $\theta_2=0$ and $\theta_3=0$) and passing through an area where M(3) is equal to zero.

With respect to the optimum values of the number and flip angles of CHESS pulses in the fat suppressing sequence unit 200, values which are set in accordance with the magnetostatic field amplitude of the MRI device may be installed as a part of the fat-suppressed imaging pulse sequence into the magnetic resonance imaging device in the manufacturing process in advance, or the operator using the fat-suppressed imaging pulse sequence may set it as a part of the parameter set of the imaging pulse sequence every time the imaging operation is carried out. For example, when the imaging operation is carried out, the operator sets the number of CHESS pulses and sets the repeat time Tr of the imaging operation in consideration of the magnetostatic field amplitude and the non-uniformity of the irradiation magnetic field on the input screen displayed on the display 27. Accordingly, CPU 7 automatically creates the three-dimensional data map of the longitudinal magnetization of the fat spin according to the equation (3) or the equation (6) described above, and determines the optimum flip angles of the CHESS pulses according to the procedure shown in FIG. 10.

Furthermore, the non-uniformity of the irradiation magnetic field varies in accordance with the dielectric constant or electric conductivity of the tissue of an examinee disposed in the magnetic field. Therefore, the irradiation magnetic field non-uniformity may be actually measured every examinee, and the combination of the optimum pulse number and the flip angles and the interval of the application of the respective CHESS pulses may be automatically determined in accordance with the actual arrangement of the examinee by using the actual measurement result. With respect to the measurement of the irradiation magnetic field non-uniformity, it is described in Non-patent document 4, for example, and the measurement can be performed in short time in recent years.

Non-patent document 4: "Mapping of the Radiofrequency Field" JMR, Series A103, 82-85 (1993)

The respective embodiments of the present invention have been described. However, the present invention is not limited to the above embodiments, and various modifications may be made. For example, in the embodiment 1, the combination of the optimum flip angles is determined under the condition that the pulse interval is invariable as the optimization condition of the plural CHESS pulses, however, the optimization containing the pulse interval may be performed.

Finally, an example in which the above embodiment is applied to the actual magnetic resonance imaging device will be described.

First, the MRI device of the magnetostatic field amplitude of 1.5 T is assumed, and the optimum flip angles when three CHESS pulses are used as the fat-suppressed pulse sequence are calculated by simulation. In the optimization calculation, the pulse intervals $\tau_1$, $\tau_2$ and $\tau_3$ are set to 17 msec, 17 msec and 13 msec respectively, and the application interval Tr of the pulse sequence is set to 270 msec. As a result, one kind of best combination can be obtained. The first combination corresponds to the first pulse of 117°, the second pulse of 77° and the third pulse of 180°.

Figure 14:
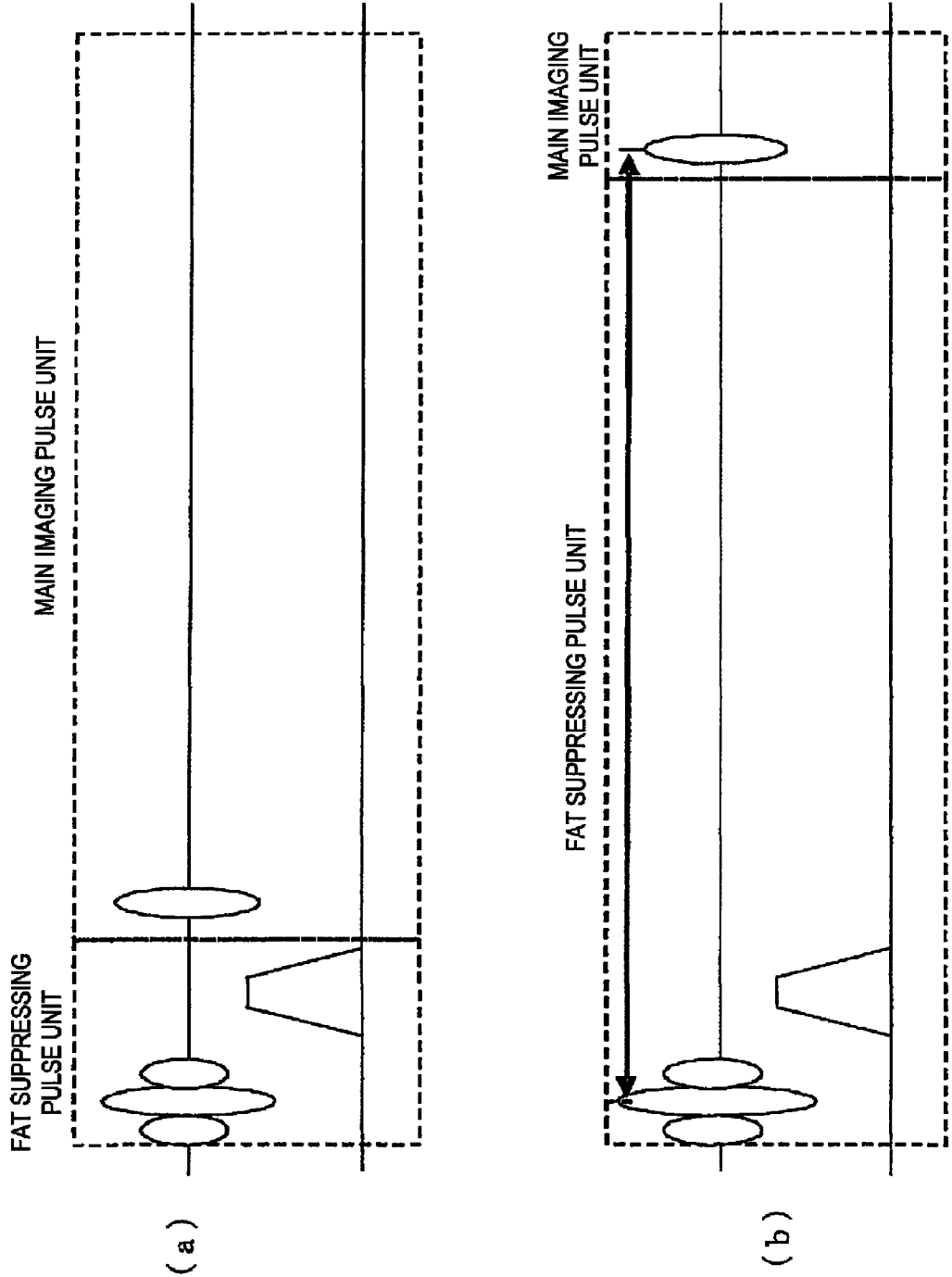
FIG. 14 is a sequence diagram when a single 90° pulse is used as a fat suppressing pulse.

FIG. 13 shows a simulation result (solid line) of the dependency of the longitudinal magnetization amplitude of the fat spin on the irradiation magnetic field amplitude when excited by the first combination. As a comparative example, the dependency of the longitudinal magnetization amplitude of the fat spin on the irradiation magnetic field amplitude when a single 90° pulse is used as a fat suppressing pulse as shown in FIG. 14(a) is indicated by a dashed line. As shown in FIG. 13, in this embodiment, in the range of about +/−50% of magnetic field non-uniformity, the residual longitudinal magnetization amplitude of the fat spin can be set to less than 5%, that is, can be set to substantially zero. It has been found that the actual irradiation magnetic filed non-uniformity in the actual measurement of an examinee by using a high magnetic field machine of 1.5 T is equal to about 30%, however, it has been proved that the present invention can be adapted to such non-uniformity.

In the case of the fat suppression using an inversion pulse as shown in FIG. 14(b), a time TI (about 150 msec in the 1.5 T machine) required for the magnetization of the fat spin to cross zero is necessary from the application of the inversion pulse till the application of the exciting pulse of the main imaging operation. On the other hand, in this embodiment, the time from the application of the first pulse till the application of the exciting pulse of the main imaging operation is equal to about 50 msec, and thus the time can be greatly shortened. If a short pulse is designed with keeping the selectivity of the frequency, the application time of one pulse to be constructed could be further shortened.

Figure 15:
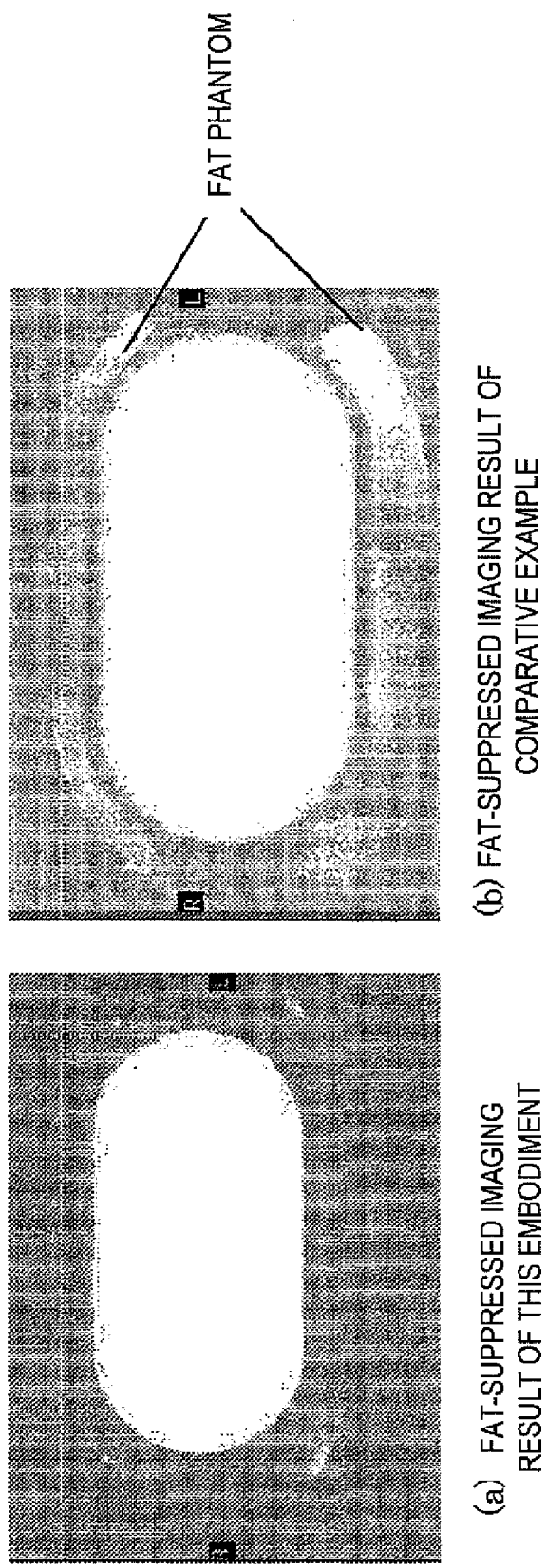
FIG. 15 shows an image when a fat phantom is used.

An imaging operation using a fat phantom and a volunteer was executed by using the first combination. The method disclosed in this embodiment 1 was adopted for the spoiler gradient magnetic field. A pulse sequence of the Fast Spin Echo method was used as the pulse sequence of the main imaging portion. As a comparative example, a single 90° pulse was used as the fat suppressing sequence unit and the other condition was set to be identical to that of the embodiment under the condition the imaging operation was executed. FIG. 15 shows an image when the fat phantom was used. In FIG. 15, (a) represents an image of this embodiment, and (b) represents an image of the comparison example. As is apparent from the figure, according to this embodiment, the signal from the fat phantom is substantially wholly suppressed. However, in the comparative example, the signal is partially suppressed, and a high signal of fat which is not suppressed appears.

Figure 17:
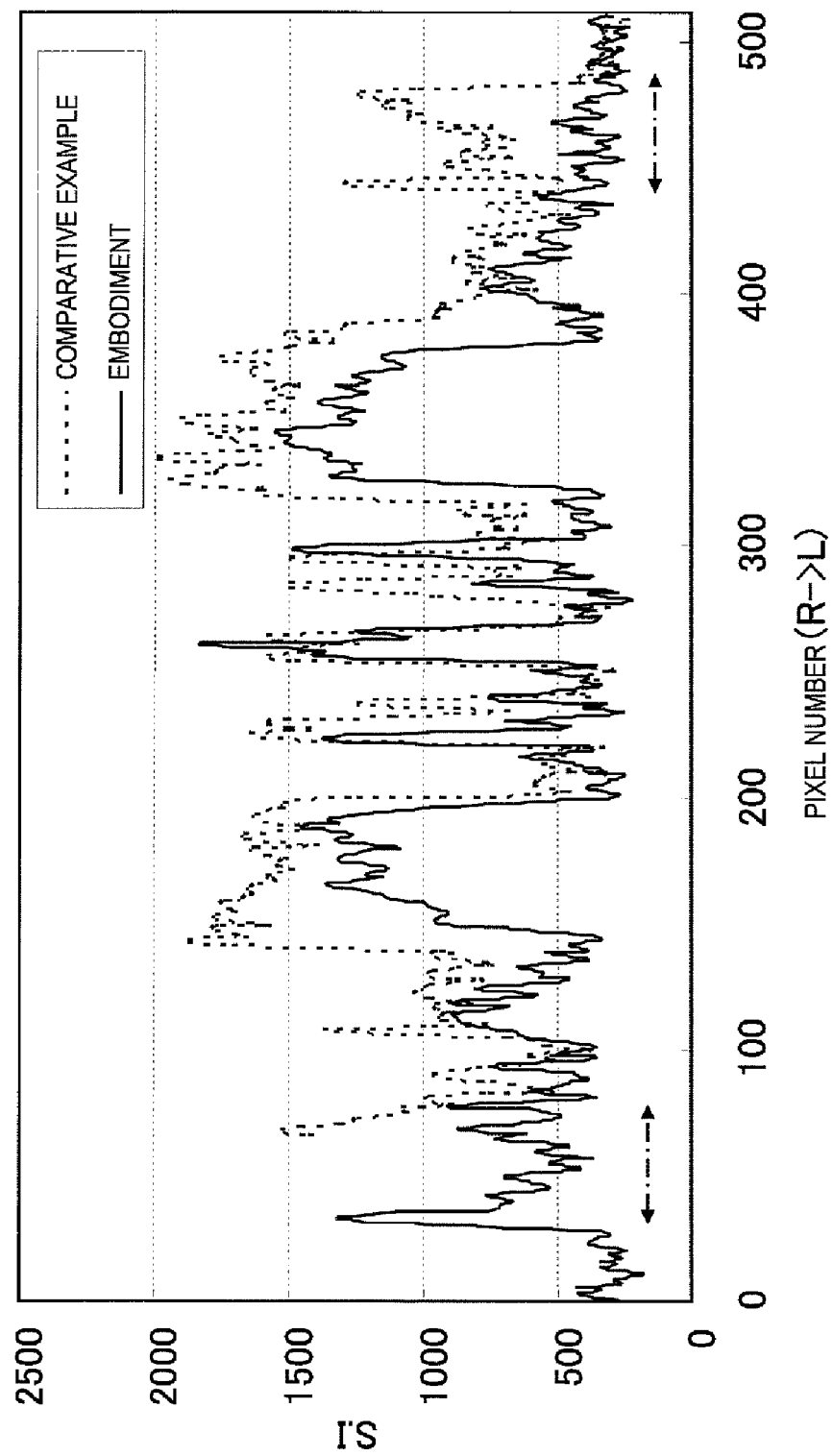
FIG. 17 is a diagram showing a line profile of an image when a volunteer is used.

FIG. 16 shows images when a volunteer is used, and FIG. 17 shows line profiles thereof. In FIG. 16, (a) represents an image of the embodiment of the present invention, and (b) represents an image of the comparative example. In FIG. 17, a solid line represents the embodiment of the present invention, and a dash line represents a comparative example. A portion indicated by one-dotted chain line corresponds to subcutaneous fat, and it has been found from observation of this portion that the fat signal can be more greatly suppressed in this embodiment of the present invention as compared with the comparative example (when only one shot of CHESS pulse is used).

Furthermore, FIG. 18 shows an actual measurement of profile variation (variation of the longitudinal magnetization M(3)) of a fat-suppressed area when the overall CHESS pulse intensity is varied between Amp40-140% under the state that the ratio of the flip angles of the three CHESS pulses is kept to the above value. Amp 100% corresponds to the CHESS pulse intensity corresponding to the flip angle of 90°.

FIG. 18(a) shows an example of a pickup image of the phantom, and the low signal area of the center portion corresponds to the fat-suppressed area. The profile at the position indicated by a vertically dotted line of the phantom image is shown in FIGS. 18(b)(c). FIG. 18(b) shows the profile variation when the CHESS pulse intensity is varied in the conventional one-CHESS-pulse case. It is found that the intensity of the profile (the longitudinal magnetization Mz) is varied as the CHESS pulse intensity is varied. On the other hand, FIG. 18(c) shows the profile variation when the intensities of the three CHESS pulses of the present invention are varied. It is found that when Amp is equal to 65% or more, the intensity of the profile (the longitudinal magnetization Mz) is not dependent on the CHESS pulse intensity under the state of Mz≅0. This shows that the state that longitudinal magnetization Mz is not dependent on the irradiation intensity of the CHESS pulse can be implemented in the fat suppressing sequence of the invention of this application.

Figure 19:
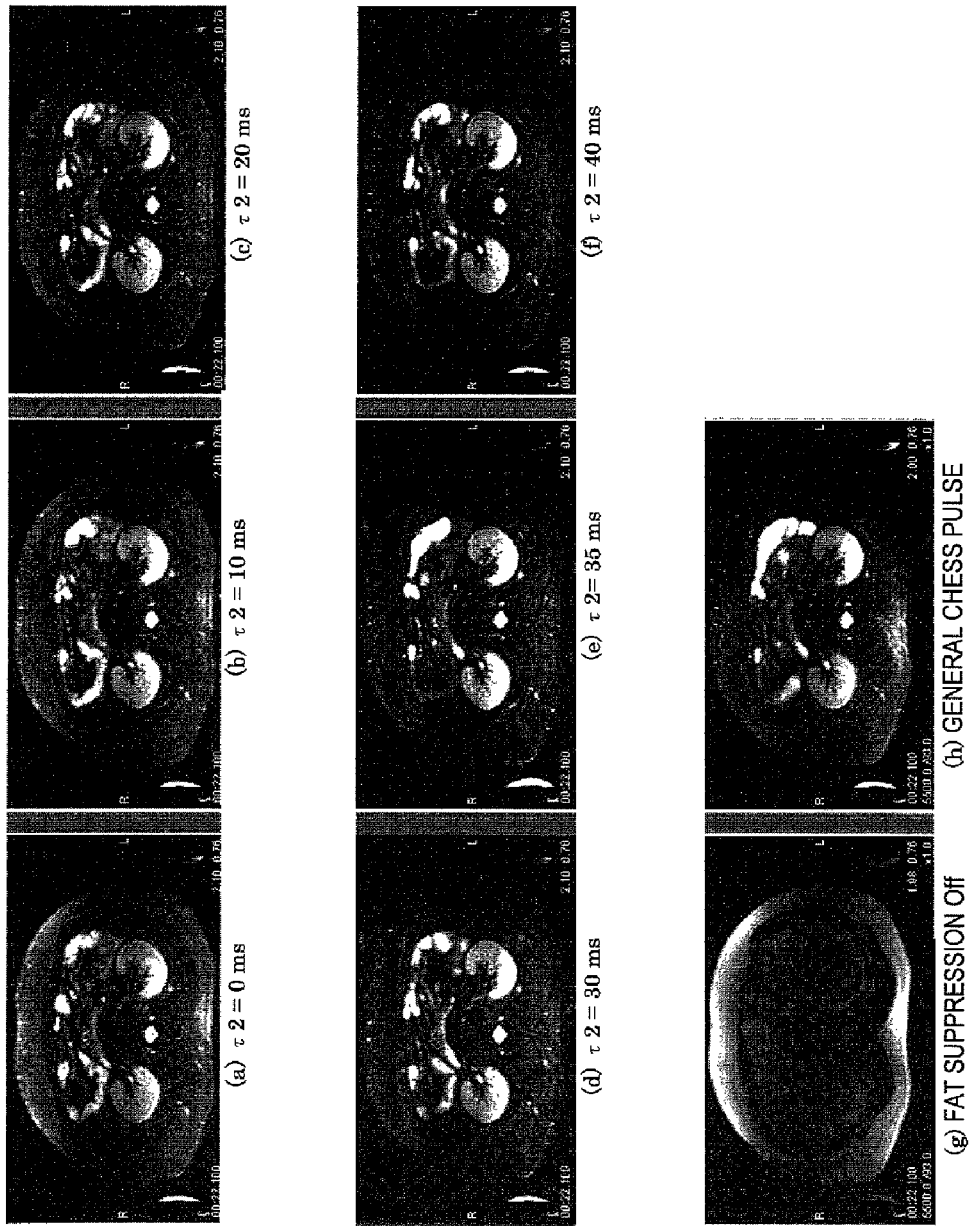
FIG. 19 shows an image obtained by imaging an abdominal part when the time interval τ2 is changed.

In FIG. 19, (a) to (f) are diagrams showing abdominal pickup images when the time interval τ2 is varied, (g) is a diagram showing an abdominal pickup image when the fat suppression is set to off, and (h) is a diagram showing an abdominal pickup image when the fat suppression is carried out by general one CHESS pulse. As described above, as τ2 is extended, the fat tissue is gradually suppressed, and the overall fat tissue can be uniformly controlled at τ2=about 30 msec (M(3)=about −0.1 M0). This result shows that the control of the longitudinal magnetization described above can be also performed in the case of the actual volunteer as expected by the computer simulation.

FIG. 1
1 . . . MAGNETOSTATIC FIELD GENERATING SYSTEM
2 . . . GRADIENT MAGNETIC FIELD GENERATING SYSTEM
3 . . . TRANSMISSION SYSTEM
4 . . . RECEPTION SYSTEM
5 . . . SIGNAL PROCESSING SYSTEM
6 . . . SEQUENCER
9 . . . GRADIENT MAGNETIC FIELD COIL
10 . . . GRADIENT MAGNETIC FIELD POWER SOURCE
11 . . . HIGH FREQUENCY OSCILLATOR
12 . . . MODULATOR
14 . . . HIGH FREQUENCY IRRADIATION COIL
15 . . . HIGH FREQUENCY RECEPTION COIL
17 . . . ORTHOGONAL PHASE DETECTOR
23 . . . MAGNETOOPTICAL DISK
24 . . . MAGNETIC DISK
25 . . . TRACK BALL OR MOUSE
26 . . . KEYBOARD
27 . . . DISPLAY

FIG. 2
200 . . . FAT SUPPRESSING SEQUENCE UNIT
210 . . . MAIN IMAGING SEQUENCE UNIT

FIG. 3
First Pulse

FIG. 4
(a) BEFORE FAT SUPPRESSION 脂肪抑制前
FREQUENCY 周波数
SPECTRUM OF LIPID (脂質のスペクトル),
WATER SPECTRUM (水スペクトル)
(b) AFTER FAT SUPPRESSION UNDER Mz≅0(Mz≅0 とした脂肪抑制後)
FREQUENCY 周波数
WATER SPECTRUM 水スペクトル
(c) AFTER FAT SUPPRESSION UNDER Mz≅−0.1 M0
(Mz≅−0.1 M0 とした脂肪抑制後)
FREQUENCY 周波数
WATER SPECTRUM (水スペクトル),
CANCEL (キャンセル)
脂質 LIPID

Figure 5:
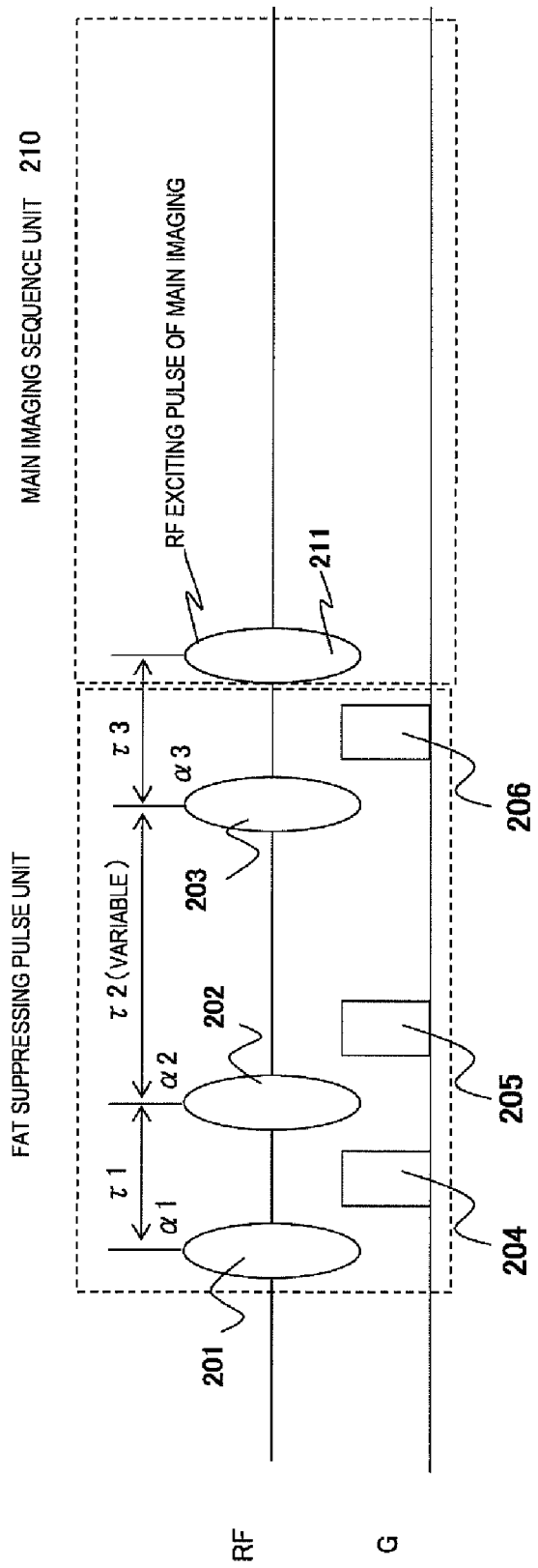
FIG. 5 is a diagram showing a pulse sequence for exciting longitudinal magnetization M(3) of the lipid component to a desired value in a main imaging sequence unit 210 when a first RF pulse is applied in an embodiment 2.

FIG. 5
FAT SUPPRESSING PULSE UNIT 脂肪抑制パルス部
MAIN IMAGING SEQUENCE UNIT
210 本撮像シーケンス部
RF EXCITING PULSE OF MAIN
IMAGING 本撮像の RF 励起パルス
τ2 (VARIABLE) τ2 (可変)

FIG. 6
Mz: RANGE FROM −1 TO 1 Mz: −1~1 の範囲

Figure 7:
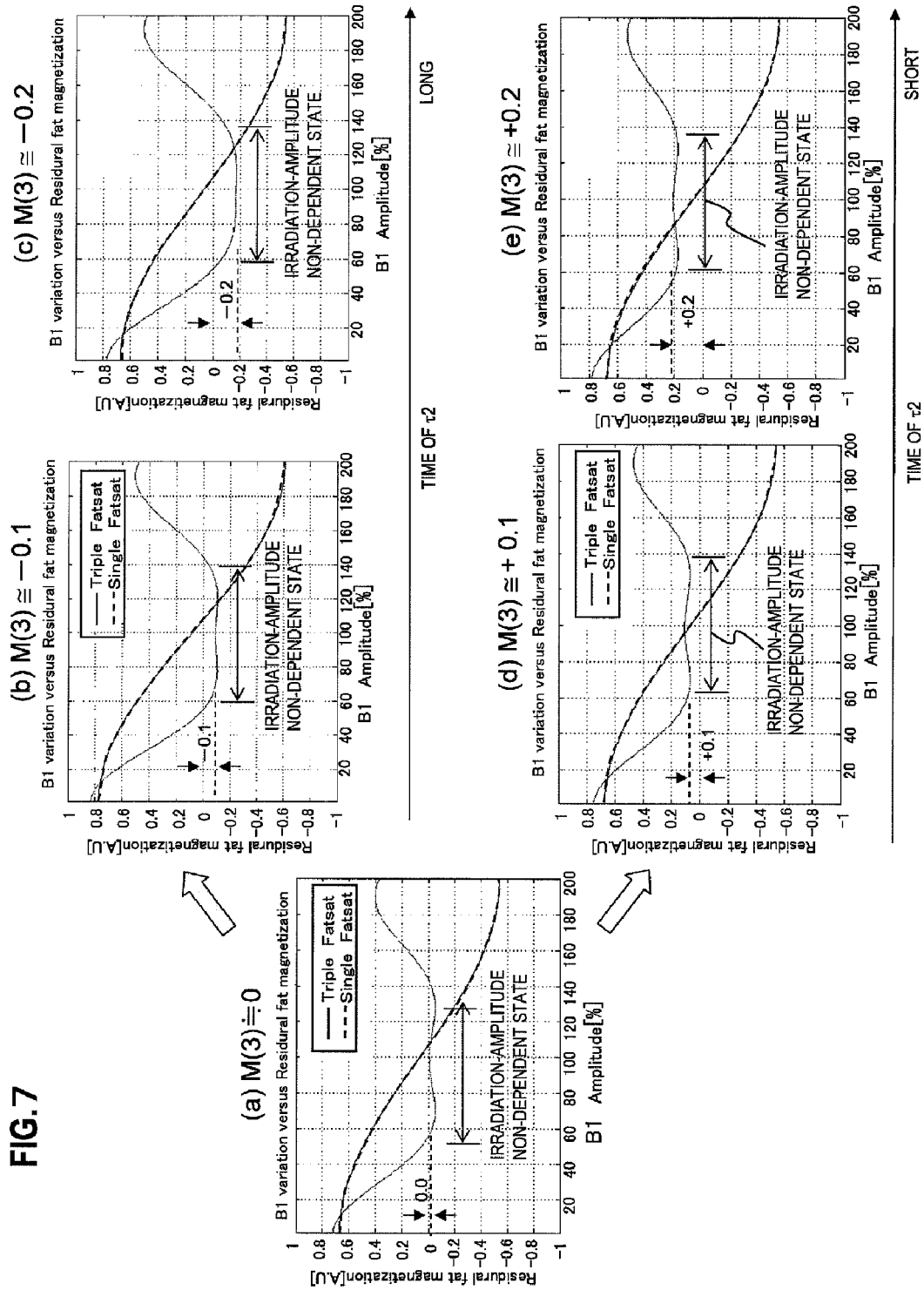
FIG. 7 is a diagram showing the relationship between the change of the time interval τ2 and the longitudinal magnetization M(3) of the normal lipid component under application of the first RF pulse in the main imaging sequence unit 210 in the embodiment 2.

FIG. 7
(a) To (e)
IRRADIATION-AMPLITUDE NON-DEPENDENT STATE 照射強度に依存しない状態
TIME OF τ2 τ2 の時間, LONG 長い, SHORT 短い

FIG. 8
801 . . . INPUT FLIP ANGLE (FA) FROM OPERATOR
802 . . . CONVERT FROM FA TO LONGITUDINAL MAGNETIZATION M(3) TO BE EXCITED
803 . . . CONVERT FROM M(3) TO τ2
804 . . . GENERATE PULSE SEQUENCE
805 . . . MEASUREMENT

FIG. 9
FAT SUPPRESSING SEQUENCE UNIT 200
MAIN IMAGING SEQUENCE UNIT 210
FIG. 10
1001 . . . CREATE THREE-DIMENSIONAL DATA MAP OF M(3) VALUES WITH $\theta_1$, $\theta_2$ and $\theta_3$ SET AS THREE AXES
1002 . . . FIND OUT AREA OF M(3)≅0 IN THREE-DIMENSIONAL DATA MAP
1003 . . . CREATE THREE-DIMENSIONAL DATA MAP OF DIFFERENTIAL VALUE dM OF M(3) VALUE
1004 . . . FIND OUT AREA WHERE dM IS EQUAL TO OR LESS THAN THRESHOLD VALUE IN THREE-DIMENSIONAL DATA MAP OF dM
1005 . . . FIND OUT AND AREA BETWEEN AREA FOUND OUT IN STEP 1002 AND AREA FOUND OUT IN STEP 1004
S1006 . . . DETERMINE FLIP ANGLES $\theta_1$, $\theta_2$ and $\theta_3$ AT CENTER POSITION OF AND AREA AS OPTIMUM FLIP ANGLE COMBINATION
FIG. 13
IRRADIATION MAGNETIC FIELD DEPENDENCE OF RESIDUAL
MAGNETIZATION 残留磁化の照射磁場依存性
RESIDUAL LONGITUDINAL
MAGNETIZATION 残留縦磁化
B1 MAGNETIC FIELD AMPLITUDE B1 磁場強度
EMBODIMENT 実施例, COMPARATIVE EXAMPLE 比較例
FIG. 14
FAT SUPPRESSING PULSE UNIT 脂肪抑制パルス部分
MAIN IMAGING PULSE UNIT 本撮像パルス部分
FIG. 15
(a) FAT-SUPPRESSED IMAGING RESULT OF THIS EMBODIMENT
(b) FAT-SUPPRESSED IMAGING RESULT OF COMPARATIVE EXAMPLE FAT
PHANTOM 脂肪ファントム
FIG. 16
(a) IMAGE OF THIS EMBODIMENT
(b) IMAGE OF COMPARATIVE EXAMPLE
FIG. 17
PIXEL NUMBER ピクセル番号
COMPARATIVE EXAMPLE 比較例, EMBODIMENT 実施例
FIG. 18
(a) PHANTOM IMAGING EXAMPLE ファントム撮像例
PROFILE LINE Profile ライン
FAT-SUPPRESSED AREA 脂肪抑制領域
(b) 1-PULSE FAT SUPPRESSION (CONVENTIONAL)
1 パルス脂肪抑制(従来)
SIGNAL INTENSITY 信号強度, PIXEL NUMBER ピクセル番号
(c) 3-PULSE FAT SUPPRESSION (THIS APPLICATION)
3 パルス脂肪抑制(本願)
SIGNAL INTENSITY 信号強度, PIXEL NUMBER ピクセル番号
FIG. 19
(g) FAT SUPPRESSION Off 脂肪抑制 Off
(h) GENERAL CHESS PULSE 一般的な CHESS パルス

The invention claimed is:

1. A magnetic resonance imaging device comprising
magnetostatic field generating means for generating magnetostatic field in an imaging space in which an examinee is disposed,
gradient magnetic field generating means for generating gradient magnetic field in the imaging space,
high frequency magnetic field generating means for generating high frequency magnetic field in the imaging space,
receiving means for detecting a nuclear magnetic resonance signal generated from the examinee,
image creating means for creating an image by using the nuclear magnetic resonance signal detected by the receiving means, and
control means for controlling the magnetostatic field generating means, the gradient magnetic field generating means, the high frequency magnetic field generating means and the receiving means according to a predetermined pulse sequence, the predetermined pulse sequence containing
an unnecessary material suppressing sequence unit for suppressing signals from unnecessary materials which are not measurement targets, and
a main imaging sequence unit for measuring a nuclear magnetic resonance signal used to create the image of the examinee,
wherein the unnecessary material suppressing sequence unit generates at least two or more RF magnetic field pulses whose flip angles are adjusted so that longitudinal magnetization of the unnecessary materials is spatially uniform in the imaging space before and when a first high-frequency magnetic field pulse is applied in the main imaging sequence unit.

2. The magnetic resonance imaging device according to claim 1, wherein said adjustment is performed by setting flip angles of the two or more high-frequency magnetic field pulses as variables, using a calculating equation for calculating the longitudinal magnetization of the unnecessary material under application of a first high-frequency magnetic field pulse in the main imaging sequence unit, and adjusting a calculation value based on the calculating equation to determine optimum values of the two or more high-frequency magnetic field pulses.

3. The magnetic resonance imaging device according to claim 2, wherein said adjustment is performed by displaying variation of the value of the longitudinal magnetization of a specific nuclear specifies of the examinee with change of the flip angles on a two-dimensional or three-dimensional graph, and finding out an area in which the calculation value is low on the two-dimensional or three-dimensional graph, thereby adjusting the optimum values.

4. The magnetic resonance imaging device according to claim 3, wherein said adjustment is performed by setting a line segment on the low area of the two-dimensional or three-dimensional graph, and finding out a line segment on which an area containing low calculation values is large in the profile on the line segment concerned, thereby adjusting the optimum values.

5. The magnetic resonance imaging device according to claim 4, wherein the two axes of the two-dimensional or the three axes of three-dimensional graph are represented in terms of logarithm, and the line segment has a gradient of 1 on the two-dimensional or three-dimensional graph.

6. The magnetic resonance imaging device according to claim 1, wherein said adjusting is performed by having evaluation function operating means comprising longitudinal magnetization of a specific nuclear specifies of the examinee and a differential value thereof, and executing an optimization calculation so that the evaluation function is lowered, thereby adjusting the optimum values.

7. The magnetic resonance imaging device according to claim 6, wherein the evaluation function comprises the sum of the longitudinal magnetization of the specific nuclear specifies of the examinee and the differential value thereof.

8. The magnetic resonance imaging device according to claim 7, wherein the evaluation function is obtained by multiplying the sum of the longitudinal magnetization of the specific nuclear specifies of the examinee and the differential value thereof by the sum of the flip angles of the two or more high-frequency magnetic field pulses.

9. The magnetic resonance imaging device according to claim 7, wherein the evaluation function is obtained by adding the sum of the longitudinal magnetization of the specific nuclear specifies of the examinee and the differential value thereof with the sum of the flip angles of the two or more high-frequency magnetic field pulses.

10. The magnetic resonance imaging device according to claim 1, wherein the control means controls an application interval between the two or more high-frequency magnetic field pulses or an application interval between the last high-frequency magnetic field pulse of the two or more high-frequency magnetic field pulses and a first high-frequency magnetic field pulse in the main imaging sequence unit, whereby the longitudinal magnetization of the unnecessary material under application of the first high-frequency magnetic field pulse in the main imaging sequence unit is controlled to be equal to a desired value.

11. The magnetic resonance imaging device according to claim 10, wherein the control means lengthens or shortens one of the application intervals of the two or more high-frequency magnetic field pulses, whereby the longitudinal magnetization of the unnecessary material under application of the first high-frequency magnetic field pulse in the main imaging sequence unit is controlled to be equal to a desired value.

12. The magnetic resonance imaging device according to claim 11, wherein the number of the two or more high-frequency magnetic field pulses is equal to three, and the control means lengthens the application interval between the second high-frequency pulse and the third high-frequency pulse, whereby the longitudinal magnetization of the unnecessary material under application of the first high-frequency magnetic field pulse in the main imaging sequence unit is controlled to be equal to a negative value.

13. The magnetic resonance imaging device according to claim 11, wherein the number of the two or more high-frequency magnetic field pulses is equal to three, and the control means shortens the application interval between the second high-frequency pulse and the third high-frequency pulse, whereby the longitudinal magnetization of the unnecessary material under application of the first high-frequency magnetic field pulse in the main imaging sequence unit is controlled to be equal to a positive value.

14. The magnetic resonance imaging device according to claim 10, wherein the number of the two or more high-frequency magnetic field pulses is equal to three, and the high frequency magnetic field pulses for which the application interval is controlled are the third high frequency pulse and the high frequency magnetic field pulse which is first applied in the main imaging sequence unit.

15. The magnetic resonance imaging device according to claim 10, wherein the longitudinal magnetization of the unnecessary material under application of the first high frequency magnetic field pulse in the main imaging sequence unit has a positive value, the value concerned is a value of longitudinal magnetization of a fatty acid type lipid component having the same resonance frequency as that of hydrogen protons in water molecules, and an application timing of a signal reading gradient magnetic field pulse is controlled in the main imaging sequence, whereby a nuclear magnetic resonance signal caused by the fatty acid type lipid component is canceled.

16. The magnetic resonance imaging device according to claim 10, wherein the longitudinal magnetization of the unnecessary material under application of the first high frequency magnetic field pulse in the main imaging sequence unit has a negative value, the value concerned is a value of longitudinal magnetization of a fatty acid type lipid component having the same resonance frequency as that of hydrogen protons in water molecules.

17. The magnetic resonance imaging device according to claim 1, wherein the longitudinal magnetization control pulse unit comprises at least two or more high frequency magnetic pulses and a spoiler gradient magnetic field applied subsequently to the high frequency magnetic field pulses.

18. The magnetic resonance imaging device according to claim 17, wherein the spoiler gradient magnetic field is applied to the three axes of X, Y and Z at the same time, and application amounts thereof are different from one another.

19. The magnetic resonance imaging device according to claim 17, wherein the spoiler gradient magnetic field is applied to the three axes of X, Y and Z at the same time, and the application amount thereof increases twice every time the at least two or more high frequency magnetic field pulses are applied.

20. The magnetic resonance imaging device according to claim 17, wherein the spoiler gradient magnetic field is applied to one axis or two axes of X, Y and Z at the same time, and application axes are mutually different every application of the spoiler gradient magnetic field.

21. A magnetic resonance imaging device comprising:
a magnetostatic field generating unit that generates a magnetostatic field in an imaging space in which an examinee is disposed;
a gradient magnetic field generating unit that generates a gradient magnetic field in the imaging space;
a high frequency magnetic field generating unit that generates a high frequency magnetic field in the imaging space,
a receiving system that receives and detects a nuclear magnetic resonance signal generated from the examinee,
an image creating unit that generates an image by using the nuclear magnetic resonance signal detected by the receiving system, and
a control unit that controls the magnetostatic field generating unit, the gradient magnetic field generating unit, the high frequency magnetic field generating unit and the receiving system according to a predetermined pulse sequence that contains
an unnecessary material suppressing sequence unit for suppressing signals from unnecessary materials which are not measurement targets, and
a main imaging sequence unit for measuring a nuclear magnetic resonance signal used to create the image of the examinee,
wherein the unnecessary material suppressing sequence unit generates at least two RF magnetic field pulses configured so that longitudinal magnetization of the unnecessary materials is spatially uniform in the imaging space before and when a first high-frequency magnetic field pulse is applied in the main imaging sequence unit.

\* \* \* \* \*